United States Patent
Nienaber

(10) Patent No.: US 12,250,086 B2
(45) Date of Patent: Mar. 11, 2025

(54) PHASE SECTOR BASED SIGNAL CHARGE ACQUISITION

(71) Applicant: David K Nienaber, Colorado Springs, CO (US)

(72) Inventor: David K Nienaber, Colorado Springs, CO (US)

(*) Notice: Subject to any disclaimer, the term of this patent is extended or adjusted under 35 U.S.C. 154(b) by 0 days.

(21) Appl. No.: 15/141,324

(22) Filed: Apr. 28, 2016

(65) Prior Publication Data
US 2017/0222767 A1   Aug. 3, 2017

Related U.S. Application Data

(60) Division of application No. 13/651,259, filed on Oct. 12, 2012, now Pat. No. 9,490,944, and a
(Continued)

(51) Int. Cl.
*H04B 1/06* (2006.01)
*G01R 23/167* (2006.01)
(Continued)

(52) U.S. Cl.
CPC ............ *H04L 1/206* (2013.01); *G01R 23/167* (2013.01); *H03D 1/00* (2013.01); *H04B 1/0021* (2013.01);
(Continued)

(58) Field of Classification Search
CPC . H03H 7/00; H03M 1/12; H03M 3/02; H04B 1/00; H04B 1/06; H04B 1/10; H04B 1/16;
(Continued)

(56) References Cited

U.S. PATENT DOCUMENTS

| | | |
|---|---|---|
| 4,583,048 A | 4/1986 | Gumacos et al. |
| 5,142,553 A | 8/1992 | Rosenkranz |

(Continued)

FOREIGN PATENT DOCUMENTS

| | | |
|---|---|---|
| EP | 0208817 | 12/1990 |
| EP | 0757446 | 2/1997 |

(Continued)

OTHER PUBLICATIONS

Amir Ghaffari, Eric A.M. Klumperink, Michie! C.M. Soer, and Bram Nauta; Tunable High-Q N-Path Brand-Pass Filters: Modeling and Verification; IEEE Journal of Solid-State Circuits; vol. 46, No. 5; May 2011; pp. 998-1010.

(Continued)

*Primary Examiner* — Shawkat M Ali

(57) ABSTRACT

A method and system for extracting values representative of modulation signal components from a modulated signal, the modulated signal containing a modulation signal, including developing a local clock signal which correlates in time to the modulated signal and includes a number of phase sectors per cycle and converting the modulated signal into a current that is representative of the signal and routing the current to the inverting input of an amplifier and charging one of a plurality of capacitive devices during each phase sector and sequentially connecting the capacitive devices between the output of the amplifier and the inverting input of the amplifier in non-overlapping sequences, the total of sequences being equal to one full cycle of the clock.

20 Claims, 15 Drawing Sheets

Related U.S. Application Data continuation-in-part of application No. 13/827,966, filed on Mar. 14, 2013, now Pat. No. 8,817,854, and a continuation-in-part of application No. 13/830,092, filed on Mar. 14, 2013, now Pat. No. 9,100,181, and a continuation-in-part of application No. 14/053,360, filed on Oct. 14, 2013, now Pat. No. 9,225,368, and a continuation-in-part of application No. 14/051,082, filed on Oct. 10, 2013, now Pat. No. 9,264,268, and a continuation-in-part of application No. 14/252,336, filed on Apr. 14, 2014, and a continuation-in-part of application No. 14/252,266, filed on Apr. 14, 2014, and a continuation-in-part of application No. 14/252,360, filed on Apr. 14, 2014, and a continuation-in-part of application No. 14/253,862, filed on Apr. 15, 2014.

(60) Provisional application No. 61/808,206, filed on May 24, 2013.

(51) Int. Cl.
| | | |
|---|---|---|
| H03D 1/00 | (2006.01) | |
| H04B 1/00 | (2006.01) | |
| H04L 1/08 | (2006.01) | |
| H04L 1/20 | (2006.01) | |
| H04B 1/04 | (2006.01) | |

(52) U.S. Cl.
CPC ............... *H04B 1/06* (2013.01); *H04L 1/08* (2013.01); *H03D 2200/006* (2013.01); *H03D 2200/0062* (2013.01); *H04B 2001/0491* (2013.01)

(58) Field of Classification Search
CPC ........... H04B 1/44; H04L 1/206; H04L 25/40; H04L 25/49; H04L 27/06; H04L 27/14
USPC ............. 320/145; 341/143, 172; 342/357.73, 342/357.77; 375/219, 232, 296, 340, 375/350; 455/205, 341; 708/200, 801
See application file for complete search history.

(56) References Cited

U.S. PATENT DOCUMENTS

| | | | |
|---|---|---|---|
| 5,208,653 A | 5/1993 | Mark et al. | |
| 5,621,345 A | 4/1997 | Lee et al. | |
| 5,784,414 A | 7/1998 | Bruekers et al. | |
| 5,841,811 A | 11/1998 | Song | |
| 5,923,030 A | 7/1999 | Assard et al. | |
| 5,937,013 A | 8/1999 | Lam et al. | |
| 5,953,370 A | 9/1999 | Durrant et al. | |
| 6,107,871 A * | 8/2000 | Shin | H03H 19/004 327/554 |
| 6,181,740 B1 | 1/2001 | Yasuda | |
| 6,317,452 B1 | 11/2001 | Durrant et al. | |
| 6,337,888 B1 | 1/2002 | Huang et al. | |
| 6,341,216 B1 | 1/2002 | Itoh | |
| 6,397,048 B1 | 5/2002 | Toda | |
| 6,420,940 B1 | 7/2002 | Minnis et al. | |
| 6,449,304 B1 | 9/2002 | Holmes et al. | |
| 6,650,264 B1 | 11/2003 | Chan et al. | |
| 6,741,197 B1 * | 5/2004 | Melanson | H03M 3/502 341/143 |
| 6,839,389 B2 | 1/2005 | Mehrnia et al. | |
| 7,009,549 B1 * | 3/2006 | Corsi | H03M 1/08 341/118 |
| 7,414,424 B2 | 8/2008 | Chao et al. | |
| 7,514,993 B2 | 4/2009 | Konchitsky | |
| 7,714,760 B2 | 5/2010 | Petrovic | |
| 7,812,750 B2 | 10/2010 | Lakdawala et al. | |
| 7,904,037 B2 | 3/2011 | Rofougaran et al. | |
| 8,278,902 B2 * | 10/2012 | Midya | H02M 1/44 323/285 |
| 8,442,097 B2 | 5/2013 | Fenton et al. | |
| 8,570,100 B2 | 10/2013 | Morishita et al. | |
| 8,654,000 B2 | 2/2014 | Waltari | |
| 8,817,854 B2 | 8/2014 | Nienaber | |
| 9,100,181 B2 | 8/2015 | Nienaber | |
| 9,225,368 B2 | 12/2015 | Nienaber | |
| 9,264,268 B2 | 2/2016 | Nienaber | |
| 9,374,116 B2 | 6/2016 | Nienaber | |
| 9,479,206 B2 | 10/2016 | Nienaber | |
| 9,484,968 B2 | 11/2016 | Nienaber | |
| 9,484,969 B2 | 11/2016 | Nienaber | |
| 9,490,944 B2 | 11/2016 | Nienaber | |
| 2002/0085117 A1 | 7/2002 | Harris et al. | |
| 2003/0083033 A1 | 5/2003 | Staszewski et al. | |
| 2003/0093278 A1 | 5/2003 | Malah | |
| 2004/0088619 A1 | 5/2004 | Hsu et al. | |
| 2005/0052304 A1 | 3/2005 | Trotter et al. | |
| 2005/0069061 A1 | 3/2005 | Petzold et al. | |
| 2005/0130610 A1 | 6/2005 | Scheck et al. | |
| 2005/0190089 A1 | 9/2005 | Draxelmayr et al. | |
| 2007/0081611 A1 | 4/2007 | Fudge et al. | |
| 2007/0230591 A1 | 10/2007 | Choi et al. | |
| 2007/0247340 A1 * | 10/2007 | Tada | H03M 3/474 341/143 |
| 2008/0081588 A1 | 4/2008 | Rofougaran et al. | |
| 2008/0298500 A1 | 12/2008 | Norris et al. | |
| 2008/0315928 A1 | 12/2008 | Waheed et al. | |
| 2009/0028269 A1 | 1/2009 | Pinkney | |
| 2009/0073822 A1 | 3/2009 | Kayanuma | |
| 2009/0110033 A1 | 4/2009 | Shattil | |
| 2009/0279650 A1 | 11/2009 | Qian | |
| 2009/0322578 A1 | 12/2009 | Petrovic | |
| 2010/0178894 A1 | 7/2010 | Romain et al. | |
| 2010/0328122 A1 * | 12/2010 | Li | H03M 3/474 341/122 |
| 2010/0328152 A1 | 12/2010 | Abraham et al. | |
| 2011/0051782 A1 | 3/2011 | Gupta et al. | |
| 2011/0163901 A1 * | 7/2011 | Quiquempoix | H03M 1/0663 341/143 |
| 2011/0169645 A1 | 7/2011 | Cartner et al. | |
| 2011/0207459 A1 | 8/2011 | Ramasamy et al. | |
| 2012/0026039 A1 | 2/2012 | Ganeshan et al. | |
| 2012/0128082 A1 * | 5/2012 | Morris | H04L 27/06 375/259 |
| 2012/0236976 A1 | 9/2012 | Smith | |
| 2012/0249888 A1 | 10/2012 | Naik et al. | |
| 2012/0257829 A1 | 10/2012 | Fam et al. | |
| 2012/0299579 A1 | 11/2012 | Knierim | |
| 2013/0119982 A1 | 5/2013 | Pirkl | |

FOREIGN PATENT DOCUMENTS

| | | |
|---|---|---|
| WO | WO 2012/087106 | 6/2012 |
| WO | WO 2014/058631 | 4/2014 |
| WO | WO 2014/058632 | 4/2014 |
| WO | WO 2014/059153 | 4/2014 |
| WO | WO 2014/059401 | 4/2014 |
| WO | WO 2014/059423 | 4/2014 |
| WO | WO 2015/160769 | 10/2015 |
| WO | WO 2015/160774 | 10/2015 |

OTHER PUBLICATIONS

Asad A. Abidi; The path ot the Software-Defined Radio Receiver; 2010 IEEE Journal of Solid-State Circuits; vol. 42, No. 5; May 2007; pp. 954-966.

David Gubbins, Bumha Lee, Pavan Kumar Hanumolu, Un-Ku Moon; Continuous-Time Input Pipeline ADCs; IEEE Journal of Solid State Circuits; Aug. 2010; 1456-1468; vol. 45, No. 8; U.S. Mark Ingels, Vito Giannini, Jonathan Borremans, Gunjan Mandal, Bjorn Debaillie, Peter Van Wesemael, Tomohiro Sano, Takaya Yamamoto, Dries Hausspi, Joris Van Driessche, Jan Craninckx; A 5mm 2 40nm LP CMOS O.1-to-3GHZ Multistandard Transceiver; 2010 IEEE International Solid-State Circuits Conference Digest of Technical Papers; Feb. 10, 2010; pp. 458-460.

(56) References Cited

OTHER PUBLICATIONS

Taehwan Oh, Nima Maghhari, David Gubbins, Un-Ku Moon; IEEE Transactions on Circuits and Systems-II Express Briefs; Jul. 2011; 417-421; vol. 58, No. 7; U.S.
International Search Report of International (PCT) Application No. PCT/US2013/062215 dated Nov. 1, 2013, 4 pages.
Written Opinion of the International Searching Authority of the International (PCT) Application No. PCT/US2013/062215 dated Nov. 1, 2013, 5 pages.
International Preliminary Report on Patentability of the International (PCT) Application No. PCT/US2013/062215 dated Aug. 29, 2014, 5 pages.
International Search Report of International (PCT) Application No. PCT/US2013/062252 dated Aug. 12, 2014, 4 pages.
Written Opinion of the International Searching Authority of the International (PCT) Application No. PCT/US2013/062215 dated Aug. 12, 2014, 15 pages.
International Preliminry Report on Patentability of the International (PCT) Application No. PCT/US2013/062252 dated Oct. 31, 2014, 15 pages.
International Search Report of International (PCT) Application No. PCT/US2013/064352 dated Dec. 23, 2013, 2 pages.
Written Opinion of the International Search Authority of the International (PCT) Application No. PCT/US2013/064352 dated Dec. 23, 2013, 9 pages.
International Preliminary Report on Patentability of the International (PCT) Application No. PCT/US2013/064352, 12 pages dated Aug. 29, 2014.
International Search Report of the Internation (PCT) Application No. PCT/US2013/064769 dated Jan. 17, 2014, 2 pages.
Written Opinion of the International Searching Authority of the International (PCT) Application No. PCT/US/2013/064769 dated Jan. 17, 2014, 6 pages.
International Prelminary Report on Patentability of the International (PCT) Application No. PCT/US2013/064769 dated Sep. 4, 2014, 7 pages.
Written Opinion of the International Searching Authority of the International (PCT) Application No. PCT/US2013/064867 dated Jan. 29, 2014, 6 pages.
International Search Report of the International (PCT) Application No. PCT/US2013/064867 dated Jan. 29, 2014, 2 pages.
International Prelminary Report on Patentability of the International (PCT) Application No. PCT/US2013/064867 dated Sep. 5, 2014, 8 pages.
International Search Report of the International (PCT) Application No. PCT/US2015/025699 dated Jul. 16, 2015, 2 pages.
Written Opinion of the International Searching Authority of the International (PCT) Application No. PCT/US2015/025699 dated Jul. 16, 2015, 10 pages.
International Prelminary Report on Patentability of the International (PCT) Application No. PCT/US2015/025699 dated Oct. 18, 2016, 11 pages.
International Search Report of the International (PCT) Application No. PCT/US2015/025704 dated Jul. 20, 2015, 2 pages.
Written Opinion of the International Searching Authority of the International (PCT) Application No. PCT/US2015/025704 dated Jul. 20, 2015, 9 pages.
International Preliminary Report on Patentability of the International (PCT) Application No. PCT/US2015/025704 dated Oct. 18, 2016, 10 pages.

* cited by examiner

PHASE SECTOR BASED SIGNAL CHARGE ACQUISITION

This is a divisional application pursuant to 35 U.S.C. § 121 and claims the benefit of earlier filed application Ser. No. 13/651,259, filed Oct. 12, 2012 for Phase Sector Based RF Signal Acquisition, pursuant to 35 U.S.C. § 120.

BACKGROUND

There are many different modulation schemes used to modulate a Radio Frequency (RF) carrier or an Intermediate Frequency (IF) carrier with a lower frequency modulation signal. There are different advantages and disadvantages to each of the commonly used methods. There are also many different wireless formats or standards used within the wireless product marketplace today. These standards differ not only in modulation technique used, but also in the bandwidth utilized by the wireless system, the RF bandwidth of a single channel, and the use, or not, of various spread spectrum techniques, such as CDMA (Code Division Multiple Access), frequency hoping techniques, or, most recently gaining in popularity, OFDM (Orthogonal Frequency Division Multiplexing). An idealized goal of a Software Defined Radio (SDR) system is to be able to transmit and receive using any of these techniques and to be able to switch between them by merely changing the software code running on such an SDR system.

Cognitive Radio Systems, as currently envisioned within the R&D community, include plans for flexible transceiver's, which can adjust to band utilization variations as needed, changing frequency bands, modulation techniques, and transmission bandwidths as required to make best use of the current RF environment. This discussion continues, yet currently there is not even a cost effective or efficient method to implement a fully flexible SDR.

Given the lack of fully flexible SDR technology, each of the many differing modulation techniques and wireless standards have historically required different customized analog front-end receiver blocks and customized back-end analog transmitter blocks for each bandwidth, modulation technique, or wireless standard accommodated. The concept of SDR has often been put forth with the promise of a single circuit block that could, under software control, be able to operate and provide competitive performance, while working with any of the current wireless transmission schemes. Yet this promise remains unfulfilled.

The roadblocks to achieving fully flexible SDR solutions have been many. The use of IF stages, creating difficult to manage spurs, and image frequency artifacts, also create overly complex matrices of usability limitations. Each combination of center frequency, bandwidth, and modulation scheme has required specific design attention despite a theoretically programmable feature selection. Quadrature modulation and all schemes which make use of phase variation add a great deal of complexity to both reception and transmission. Maintaining orthogonality and minimizing mismatches between the I and Q channels are ongoing challenges. Conventional zero IF approaches to the SDR challenge attempt to simplify the IF complexities, but compound the I/Q mismatch and orthogonality issues and typically degrade noise performance as well. Real solutions to the SDR challenge have seemed perennially imminent, while remaining ethereal.

DESCRIPTION OF THE DRAWINGS

FIG. 3b is a timing diagram for the diagram of FIG. 3a.

DETAILED DESCRIPTION

There are many common terms used in the RF industry which are generally understood to have consistent meanings, but which can, by usage or by application, have slightly varying scope or specific meaning. For clarity, there are three terms which will now be defined very specifically, which in some cases will be used in place of more common usage meanings or terms, other such specific terms will be described upon initial use. A modulated signal is one such term, carrier signal is another, and modulation signal is another. A modulated signal is a signal which includes information representative of a modulation signal, which is superimposed, encoded, or modulated onto a carrier signal to become the modulated signal, and from which the original modulation signal can be recovered by some means. Generally, most if not all Radio Frequency (RF) signals are modulated signals, as are all Intermediate Frequency (IF) signals. The carrier signal is a single frequency sinusoidal waveform, generally higher in frequency than any of the spectral content of the modulation signal. The modulation signal is a signal superimposed on a carrier using any of a wide variety of modulation techniques common in the art.

Figure 1:
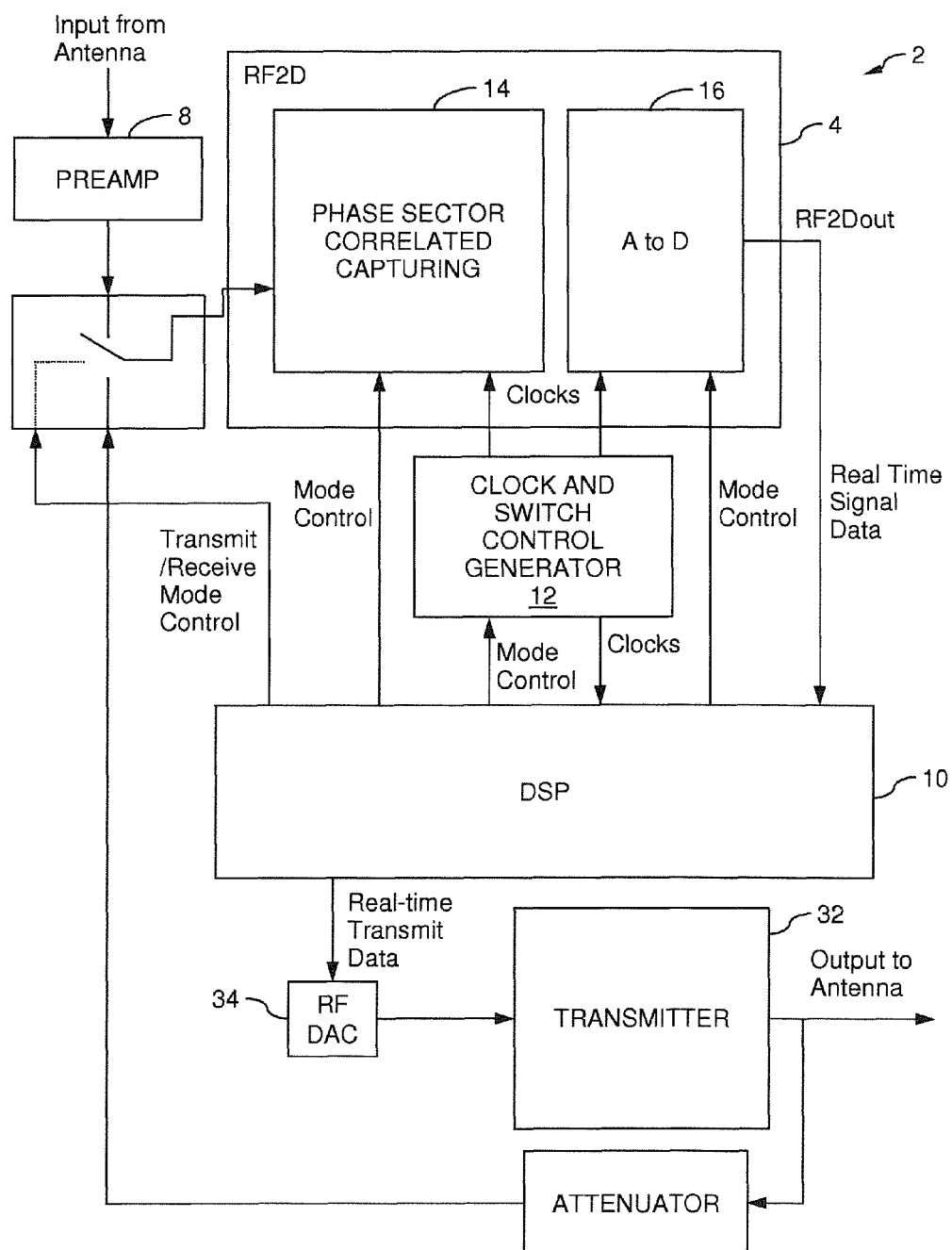
FIG. 1 is a system block diagram showing one embodiment of the present invention implemented in a phase sector based software defined radio.

Developing a more ideal receiver solution for SDR has resulted in various novel methods, blocks, circuits, and systems. Although the present invention is not limited in scope to SDR applications. FIG. 1, shows a top level block diagram of a Phase Sector Based Software Defined Radio, (PSB-SDR) system 2, based on these developments. The RF2D block 4, a novel development, is an input block that receives a wide-band modulated signal from a wide-band amplifier 8, or perhaps directly from an antenna, and outputs to a DSP block 10 a wide-band stream of data where each piece of data is representative of a modulation component and where the data is phase sector correlated. A modulation signal component here is any quantity, value, or signal, which when combined with other modulation signal components, can form a representation of a modulation signal. A representation of a modulation signal thus formed is then referred to as a reconstructed modulation signal.

To understand phase sector correlation, phase sector must first be understood and defined. A phase sector represents a span of the phase of a local clock signal, which remains essentially constant from one clock cycle to the next in the phase angle of the local clock at which it begins and in the phase angle of the local clock at which it ends. Each cycle of the local clock signal has multiple phase sectors. While it is not necessary that phase sectors be contiguous, where every possible phase angle of the local clock is thereby included in one or another phase sector; it is desirable that phase sectors remain non-overlapping so that no two phase sectors both include any one phase angle of the local clock. Generally, it is intended that phase sectors be nearly contiguous, so that every phase be included in one or another phase sector, except for transition phases at the beginning or end of a phase sector. However, it is possible to have phase sectors which have significant gaps between them, yet they should never overlap.

The local clock signal is an approximately constant frequency signal, generated by a local oscillator block 12, or timing system, where local means within the context of the receiver system, which during the normal operation of receiving a signal is intended to be at the same frequency and in a constant phase relative to the carrier signal used to construct the modulated signal input to the RF2D block 4. Generally, the actual carrier is generated at the transmitter, and the pure carrier signal itself is therefore not generally available at the receiver. Furthermore, the carrier signal is not necessarily even present within the modulated signal, depending on modulation and transmission scheme. There are various methods used to establish the correct frequency and phase for a local clock. Most methods use some form or other of either a phase or a frequency locked loop system. Such phase lock is generally achieved by first defining some window of time, established by timing format, during which the modulated signal can be relied upon to be representative of the carrier frequency, and to be at some known reference phase. However, precisely how this works can vary substantially from one system to another. The system herein described is an SDR system intended to be capable of receiving essentially any transmitted signal. It is therefore necessary for the system to be capable of all methods of frequency or phase lock.

In the most general case, the most that can be relied upon is that the local clock, when in proper frequency and phase relationship relative to the source carrier, can generally be said to be correlated in time to the modulated signal. It is important to note however, that this is not always a strong mathematical correlation in the strictest sense. Where the carrier is suppressed (not transmitted) and if the modulation factor is high (a statistically high percentage of the modulation range is utilized) this means there may not be very much of the carrier frequency contained in the modulated signal, such that the mathematical correlation may not be very high at all. In such cases, as long as the signal content of the modulated signal can still effectively be demodulated by any means, using the local clock at a frequency near or in the band of the modulated signal, then the local clock signal can still be considered as correlated in time with the modulated signal.

The term correlation is used far more strictly and quite differently for the term phase sector correlation. Here, unlike with the local clock whose correlation in time with the modulated signal might be quite low mathematically, yet still be considered correlated, phase sector correlation is intended to indicate a very high level of mathematical correlation, virtually 100%. Each phase sector amounts to a window of time during which the modulated signal gets acquired or captured, with the value captured becoming associated only with the phase sector active during the time of capture. The fact that phase sectors are non-overlapping ensures that any instantaneous time value of the input signal gets included in only one phase sector. This maintains the independence of the modulated signal values so captured and the significance of the phase sectors as separate from one another. Signal transmitted or received within a phase sectors span remains isolated and separated from signal transmitted or received during other phase sectors.

Phase sector correlation can now be understood and signal or data can be understood to be phase sector correlated whenever all data or signal captured during any one phase sector is collected or captured and kept separate from data or signal captured or collected during any other phase sector. Wherever this separation is maintained, the data or signal can be said to be phase sector correlated. Again, this correlation is a type of correlation where a high mathematical correlation is important in order for it to be phase sector correlated. In fact, phase sector correlation indicates a case where full correlation is virtually assured by design or by definition.

The data stream output of the RF2D converter block 4, RF2Dout, has an adjustable data rate, f_RF2Dout, adjustable under the control of the DSP 10 and generally chosen to be fast enough to at least provide Nyquist rate data relative to the widest band information present in the incoming signal. In this way, no loss of bandwidth in the data or signal received occurs within the RF2D block 10. It is important to note however, that it would be possible to allow a reduction in bandwidth, if so desired, within the RF2D block merely by selecting an RF2Dout speed slower than the Nyquist rate relative to the widest band information present in the incoming signal.

The first processing block within the RF2D block 4, is a discrete time processing block called Phase Sector Correlated Capturing (PSCC) 14, where the modulated signal input to the RF2D block 4 is broken up into discrete time segments and thereby sampled or acquired according to phase sector and then processed without yet being converted to a digital or binary representation of the signal. As such, the signal in this first stage still has full analog signal resolution, where the effective resolution is limited only by a noise floor present. This noise floor is formed as a combination of local circuit processing noise and noise present in the incoming signal. In one embodiment, this discrete time block also includes multiple channels of low-pass filters, which act like discrete time decimation filters on the input data. There is one filter for each phase sector. The simplest discrete time filter for this application is implemented by simply adding up the captured signal values, separately by phase sector, from one cycle to the next. In this way, each value captured during any one phase sector of one cycle of the clock is simply added together with signal values captured during the same phase sector of subsequent clock cycles.

This low pass filtering is most simply achieved by the adding up, or the accumulation, of the phase sector correlated values from one clock cycle to the next. This most typically accumulates one additional value per phase sector, once for every local clock cycle that occurs during the entirety of one full RF2Dout cycle period. Once accumulated, this results in one value passed to the DSP for each phase sector per RF2Dout cycle period. Since this occurs within a discrete time analog resolution block, the noise which is typically random or white in nature would tend to add up stochastically, whereas the signal tends to add up linearly. This yields a profound advantage for this methodology. This means the signal to noise ratio tends to improve as the signal is accumulated, by a factor roughly equal to the square root of the down-conversion factor, where the down-conversion factor is the RF or local clock rate divided by the RF2Dout rate, f_RF2Dout. This accumulation of values from one clock cycle to values accumulated from other clock cycles can generally be done with any value combining system, and is probably most simply implemented using switched capacitor techniques.

Another option, rather than down-conversion, is to pass the signal captured for each phase sector to the A to D 16 at full speed, one value per phase sector per local clock cycle. This amounts to f_RF2Dout=Fclk, where Fclk is the frequency of the local clock, which is most typically equal in frequency to the carrier frequency of the modulated signal. This would require that the DSP 10 process values coming in from the A to D 16 at a rate equal to the number of phase sectors per clock cycle times the Fclk rate. For a quadrature signal, that would be at least four times the Fclk rate. Depending upon the carrier frequency involved, that can become a large amount of individual pieces of data processed very quickly, in effect using up a great deal of the DSP block's processing power. This can also generate quite a speed challenge for the A to D block 16. Under some signal conditions this might be the preferred processing method, particularly where Fclk is not too high, but in most conditions, it is more desirable to reduce the input signal rate to the DSP 10, using the down-conversion option. In fact, in many systems this down-conversion capability is a fundamental enabler, without which, such a system simply cannot be made to work fast enough.

Figure 4:
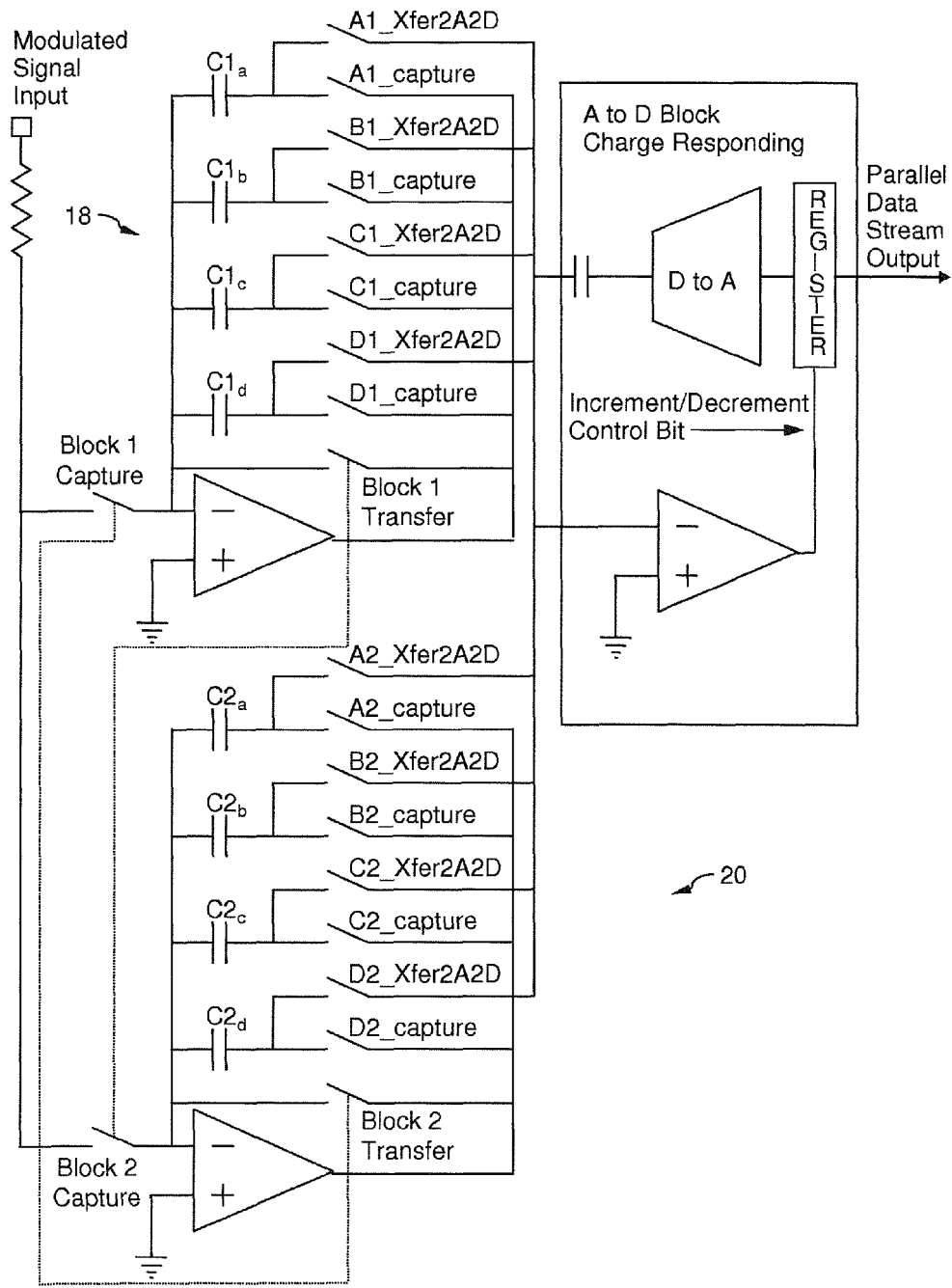
FIG. 4 is a diagram illustrating one embodiment of alternating blocks as phase sector distributed integrators with a charge responding A to D.

For a flexible and programmable system, as this PSB-SDR system 2 is intended to be, it is generally desirable to be able to capture data nearly continuously. In order to avoid regular dumping intervals during which the input signal is ignored, the RF2D block 4, in one embodiment, includes two identical discrete time processing input blocks, one receiving input values, while the other is dumping its values to a subsequent block, usually the A to D block 16. FIG. 4 illustrates one embodiment of these two blocks 18, 20 (accumulation blocks) for a phase sector integration capturing system, described below. Each of these two blocks also has their value reinitialized during its dumping period, reinitialized to a level which the A to D 16 would receive and interpret as a zero value. This occurs after it has dumped its value to the A to D 16 but before it is reconnected to new input for its subsequent acquisition phase. In this embodiment, these two blocks are included within in the Phase Sector Correlated Capturing block 14 of FIG. 1. These two blocks then alternate roles on alternate RF2Dout cycles. This allows the system to collect signal for every local clock cycle. Ultimately, this provides a better signal to noise ratio of the resulting recovered modulation signal, for any given modulated signal input, than a scheme which ignores any number of cycles of modulated signal input. This also potentially avoids, or at least minimizes potential aliasing problems, and the complexities of managing adjustable anti-aliasing filters.

Regardless of the carrier frequency of the incoming modulated signal, regardless of its bandwidth, regardless of the modulation scheme utilized, and regardless of the information the modulation contains; there is some selection of the Fclk/RF2Dout down-conversion factor, the number of phase sectors per clock cycle, and the selection of local clock frequency; such that the resulting digitized phase sector correlated values can be passed to the DSP block 10, containing the information necessary to fully decode, demodulate, filter, and present data in whatever form most desirable, for any RF signal which can be transmitted, and to do so in a way which provides the best signal to noise ratio possible. Because of this, this system is capable of the full flexibility envisioned in the original concept of SDR, as no conventional or prior art circuits or systems have been.

Figure 2:
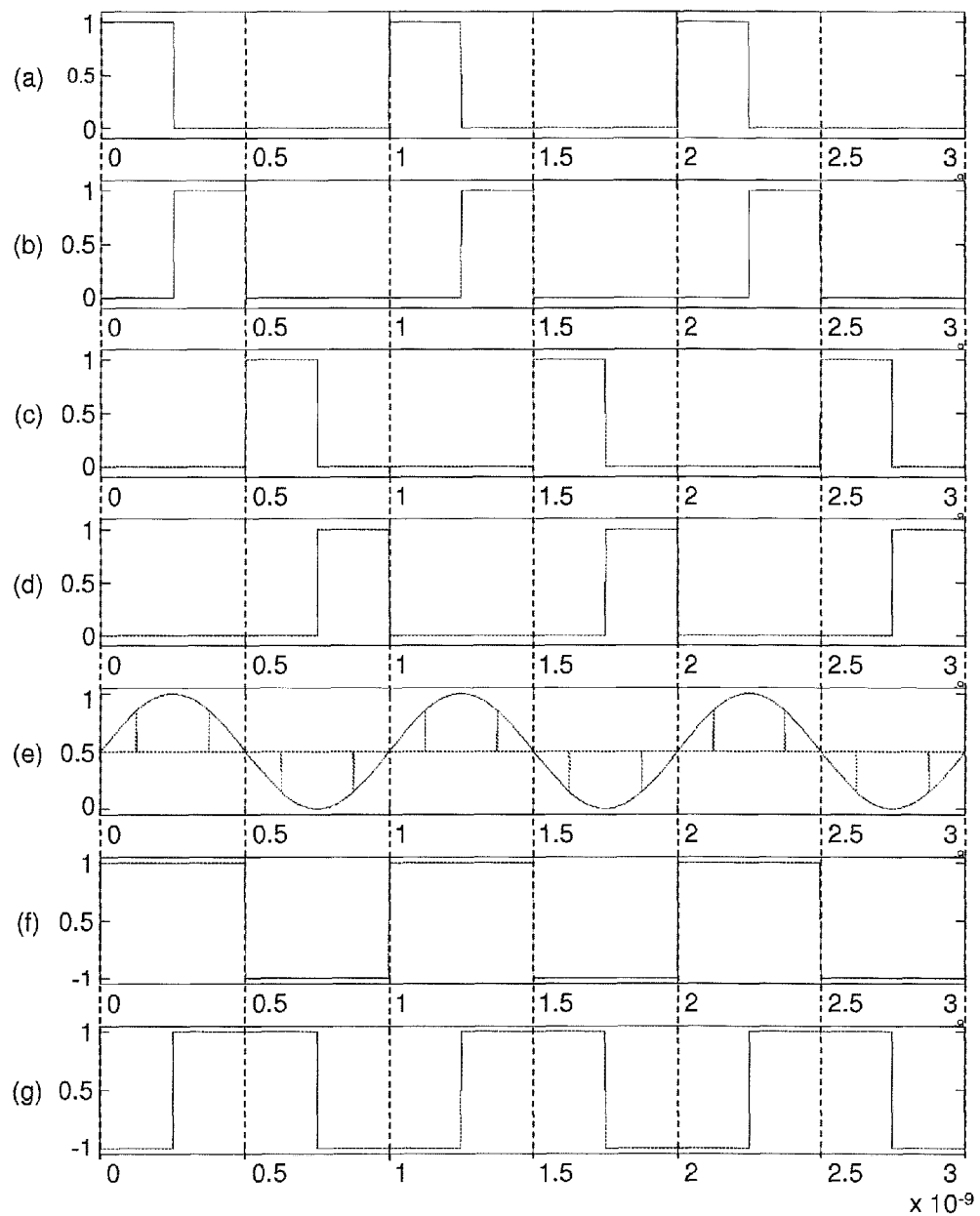
FIG. 2 is a timing signals chart for quadrature and phase sector processing.

It is instructive to consider one specific type of modulation, to see how PSCC provides benefits for a specific case. Quadrature modulation is used for many different systems, 8QAM, 16QAM, and 32QAM to name a specific few, and countless others. Quadrature modulation is also key to consider because the quadrature relationship of the I and Q signals adds the significance of phase variation, as well as generally adding complexity to the demodulation process. A quadrature modulated signal is most simply processed using PSCC, with four phase sectors per local clock cycle. FIG. 2 includes waveforms, which show the timing for each of four equally sized phase sectors at (a), (b), (c), and (d). In order to have these timing relationships, a phase lock condition between the carrier that formed the modulated signal and the local clock must exist. It is simplest to merely assume that this condition does exist for now. Such a phase lock condition can be accomplished through conventional means, using a phase locked loop, but a much preferable enhanced method for achieving this phase lock flexibly is also discussed further below.

Simple impulse sampling may not provide the best signal to noise ratio, but is the most common method of acquiring a discrete time representation of a signal, and therefore an interesting case to consider. Impulse sampling must be done at regular intervals. This, in combination with phase sector correlation, requires that each phase sector include an equal number of evenly time-spaced samples. This necessitates an integer multiple of four samples per Fclk cycle. The simplest case is again the best to consider, which is just the single sample per phase cycle case. The only remaining choice then is where to phase the impulse sample within the phase sector. Aligning each impulse sample time with the center of its phase sector, becomes the case to consider, for reasons which become more apparent as phase locking is considered, as described in greater detail below.

There are various uses of capacitors made throughout the circuits, systems, and blocks of this PSB-SDR 2. Each capacitor as described here and throughout this writing could be replaced with a capacitive device. A capacitive device, being any device or plurality of devices generally having two or more terminals, which has capacitance between two terminals such that it behaves like a conventional capacitor, in a manner sufficient so as to allow the circuit or system to behave approximately as it would if a capacitor were in its place, generally having an amount of charge stored on the device equal to the voltage across the device multiplied by its capacitance. For simplicity, the term capacitor will be generally used, with the understanding that it could be replaced by any capacitive device.

FIG. 2 (*e*) shows an incoming modulated signal, having an all in-phase (I) signal, which means that the I component is maximized, and the quadrature (Q) component is zero. While a real RF signal would have phase variation, there are only three full cycles of the modulated signal shown. The bandwidth limitations on most RF signals, would not allow the modulated signal to vary significantly in phase over three cycles, so the pure sine wave shown for FIG. 2 (e) is reasonably realistic over the time window shown. For this case, the impulse samples are also shown in FIG. 2 (e), where there are four impulse samples per cycle of the modulated signal. From left to right, these impulse samples shown in FIG. 2 (e) are for phase sectors A, B, C, D, A, B, C, D, A, B, C, and D. PSCC allows for multiple impulse samples to be accumulated over multiple Fclk cycles, as long as the accumulation is done separately for each phase sector, yielding a separate accumulated value for each phase sector, and so that any values accumulated are captured within the same phase sector, although probably over multiple cycles. This accumulation, for the impulse sampled case, can be accomplished with the addition of a switched-capacitor circuit designed for this purpose, a switched capacitor filter, providing an analog decimation filter, separately for each phase sector, accumulating the sum of the values captured on a capacitor, for later transfer to the A to D block 16. For the signal state shown in FIG. 2 (e), all of the phase sector A values would be accumulated into a single value along with those from subsequent cycles, for however many local clock cycles are included in a single RF2Dout cycle. Accumulation is the simplest approach, but a more complex switched capacitor filter could also be used here to achieve steeper band response features.

From FIG. 2 (e), it is plain to see that all of the phase sector A values are identical, as are all of the phase sectors B, C, and D values respectively. This is a direct result of the bandwidth being too narrow for the phase of the modulated signal to vary too quickly, in combination with the modulated signal having the same frequency as the Fclk. As described above, the down-conversion ratio of Fclk/RF2Dout would normally be chosen so that the bandwidth of the resulting RF2D output data would not be significantly reduced, which means generally, that there would not be much variation in the values of all of the A phase sector values over the time of their accumulation. Naturally, this also applies to the B, C, and D values respectively.

Each of the values for phase sectors A, B, C, and D, whether combined over multiple Fclk cycles or not, gets transferred and converted to a digital value by the same A to D converter 16, with resulting digital values then made available to the DSP 10, while their phase sector correlation also is provided to the DSP 10, so that each value is still identified by the A to D as data resulting from phase sector A, B, C or D. Mixing of these phase sector correlated values can then be easily performed by the DSP. The I or in-phase signal can be formed by adding data from the A and B phase sectors and subtracting the data from the C and D phase sectors, or I=A+B−C−D, where A, B, C, and D now represent digital values collected during each of their respective phase sectors, possibly over multiple Fclk cycles. The Q or quadrature signal is similarly developed by combining the phase sector values as follows, Q=B+C−A−D. In this way, each of these combinations yields one value for I and one value for Q per cycle of RF2Dout.

The conventional approach to performing a phase locked loop (PLL) function is to use a phase comparator that compares the phase of a received modulated signal to that of the local clock, usually during a predefined reference period discerned from receiving a signal with the proper timing format. The phase comparator most conventionally uses a four quadrant multiplier or an exclusive-OR block that essentially implements a binary type multiplication on the two input signals, where one is the local clock and the other is the received modulated signal, where the multiplier is only on during a predefined phase reference period. When not on, the output of this phase comparator is disabled and a low pass filter, most often just a single capacitor, holds its voltage unaltered until the next predefined reference period occurs. This type of phase comparator tends to cause a phase lock loop to lock with the two inputs to the phase comparator in quadrature with one another that is 90 degrees out of phase, which results in an equal period of charging the hold capacitor as discharging it per local clock cycle, during the predefined reference period. The output of this phase comparator is often that of a chargepump, charging or discharging the hold capacitor in response to the relative phase of the local clock and reference period signal. The voltage on the capacitor then typically becomes the control voltage input for a voltage controlled oscillator.

This same functionality can be achieved, using phase sector correlated capturing as applied to a quadrature modulation case, by employing a digital low pass filter technique on the post conversion mixed Q signal, developed within the DSP, or, alternately, by acting on a separately developed control signal having control signal values developed within the DSP from accumulated values previously discussed. This low pass filtering would then be done to obtain a control value or voltage to be applied as a control input to the local oscillator, thereby controlling its frequency, as with a convention Voltage Controlled Oscillator, (VCO), and thereby forming a PLL 10. Alternately, some of the low pass function could be reserved for an analog final stage, which could be a charge pump type design, either charging or discharging a hold capacitor, similar to that of a conventional PLL phase comparator output and VCO control input, but with the signal driving it being a digitally low pass filtered version of the Q signal. This digital low pass and/or charge pump could then be programmed, under the control of the DSP 10, to be enabled only during the correct reference period, thereby again creating an effective sample hold on the phase comparator output. The voltage on the hold capacitor is then applied to a VCO, and so controls the oscillator frequency used to develop the local clock, and the timing of the four phase sectors. This now essentially forms a fully programmable PLL. The programming for this could be changed, the precise filter response of the low-pass could be changed as with the rest of the features of this SDR system 2, to accommodate any signal/modulation format, now including the timing details of the desired phase reference period. The programming could also be changed in response to signal conditions, by having a control signal evaluator, probably formed merely by program steps operating within the DSP, which can evaluate the control signal described above, before it is low pass filtered, or any of the other signals otherwise developed within the DSP, comparing the signals to any number of characterization metrics, many determined by mere mathematical processing of the control signal, to determine what the low pass filter characteristics should be, or to determine how the control signal is processed in developing the control value or voltage used to control the VCO.

Mixing the accumulated values after any down-conversion desired, and after A to D conversion has taken place, constitutes a novel methodology called Post Conversion Mixing. This Post Conversion Mixing is advantageous in every way, as it provides for virtually no mismatch between either the I and Q channels, nor between either of those and the phase detection mixing traditionally used to provide the control voltage to control the voltage controlled local oscillator of the PLL. All of this mixing is now done post down-conversion and post analog to digital conversion, and is therefore acting on data which has been processed through a single analog block and a single analog to digital conversion process. I and Q are now formed by mathematically mixing identical data. This leaves essentially no place for I/Q mismatch to occur within the receiver. This is a major advancement over conventional techniques.

Previously, a method implementing PSCC using standard impulse sampling techniques was described. An alternative is to use Phase Sector Integration Capturing, a novel technique capable of improved noise performance and capable of continuous signal capturing, a further enhancement to be described in detail below.

Figure 3A:
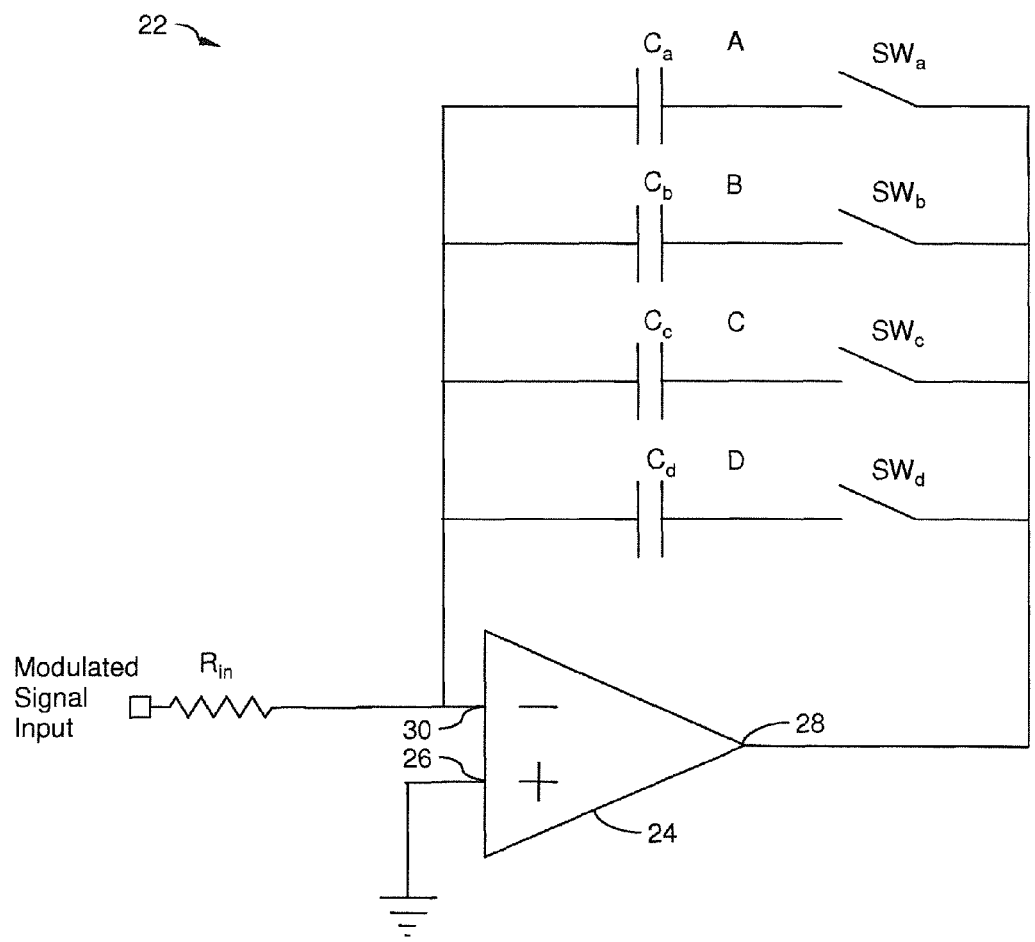
FIG. 3a is a diagram illustrating one embodiment of a phase sector distributed integrator of the present invention.

The most straight-forward or simplest way of implementing Phase Sector Integration Capturing, is to consider FIG. 3a, a phase sector distributed integrator 22. For FIG. 3a, this block 22 and its signal timing is arranged to show a specific case of Phase Sector Integration Capturing, and a special case of Phase Sector Distributed Integrator, where the system is set up to perform quadrature detection. Similarly to the description above considering the use of impulse sampling, this arrangement includes a specific selection where there are four phase sectors per local clock cycle, and where the phase relationship between the local clock and the incoming modulated signal is phase locked, just as in the impulse sampling case, in a manner and with a static phase relationships consistent with that of traditional quadrature signal detection methods.

The input signal, a modulated signal, which might be received directly from an antenna, or from a very wide-band amplified version of signal present at the antenna, or perhaps an attenuated output of a transmitter, is applied to one side of a resistor Rin, where the other side of the resistor is connected to the inverting input of an ideal op-amp 24. The positive input 26 to the op-amp is connected to a DC voltage reference level, which might be ground, and is certainly an effective AC ground. The output 28 of the op-amp is connected to four switches, SWa, SWb, SWc, SWd (for the quadrature case), where only one of the switches is closed or on at any one time. The other side of each switch is connected to one side of a capacitor, Ca, Cb, Cc, Cd, with the other side of the capacitor Ca, Cb, Cc, Cd connected back to the inverting input 30. Each switch SWa, SWb, SWc, SWd is connected to its own capacitor Ca, Cb, Cc, Cd. In this way, because of the switches SWa, SWb, SWc, SWd, only one of the capacitors Ca, Cb, Cc, Cd is connected at any one time. While one of the switches SWa, SWb, SWc, SWd is closed, the opamp 24 acts on the capacitor Ca, Cb, Cc, Cd through the switch SWa, SWb, SWc, SWd, providing whatever voltage is required to keep the inverting input of the opamp 24 essentially and approximately equal to the positive input 26 of the op-amp 24. Since the inverting input node is then maintained at a constant voltage, in this case at ground, any signal present at the input side of the resistor Rin, is converted into a current through the resistor Rin. This current has no where to go except through the capacitor Ca, Cd, Cc, Cd having its related switch SWa, SWb, SWc, SWd on. In this way each capacitor Ca, Cd, Cc, Cd, is charged with a current that is a replica of the input signal, and thereby the charge on the capacitor Ca, Cd, Cc, Cd becomes proportional to, and a replica of, the integral of the input signal during the period when its associated switch SWa, SWb, SWc, SWd is on. In this way, this block 22 becomes essentially a phase sector accumulator, accumulating a value, in this case charge, over each non-overlapping, timing system developed phase sector.

Each of the four switches SWa, SWb, SWc, SWd is then sequentially turned on, after the other switches SWa, SWb, SWc, SWd are all off, so that there is no overlapping time period where more than one switch is on. This prevents charge representing signal, which has correctly been acquired onto one capacitor Ca, Cd, Cc, Cd, from being altered by signal during a different phase of clock, or by charge on an alternate capacitor Ca, Cd, Cc, Cd. The timing of the turning on of each of the switches SWa, SWb, SWc, SWd is sequentially arranged, so that any one switches SWa, SWb, SWc, SWd period of on time, always follows the on period of the same other switch SWa, SWb, SWc, SWd. So, each switch and capacitor combination A, B, C, and D, is named so that the time when switch SWa is on always follows when switch SWd is on, SWb always follows SWa, SWc always follows SWb, and SWd always follows SWc, these four periods together complete one full cycle of the local clock.

Figure 3B:
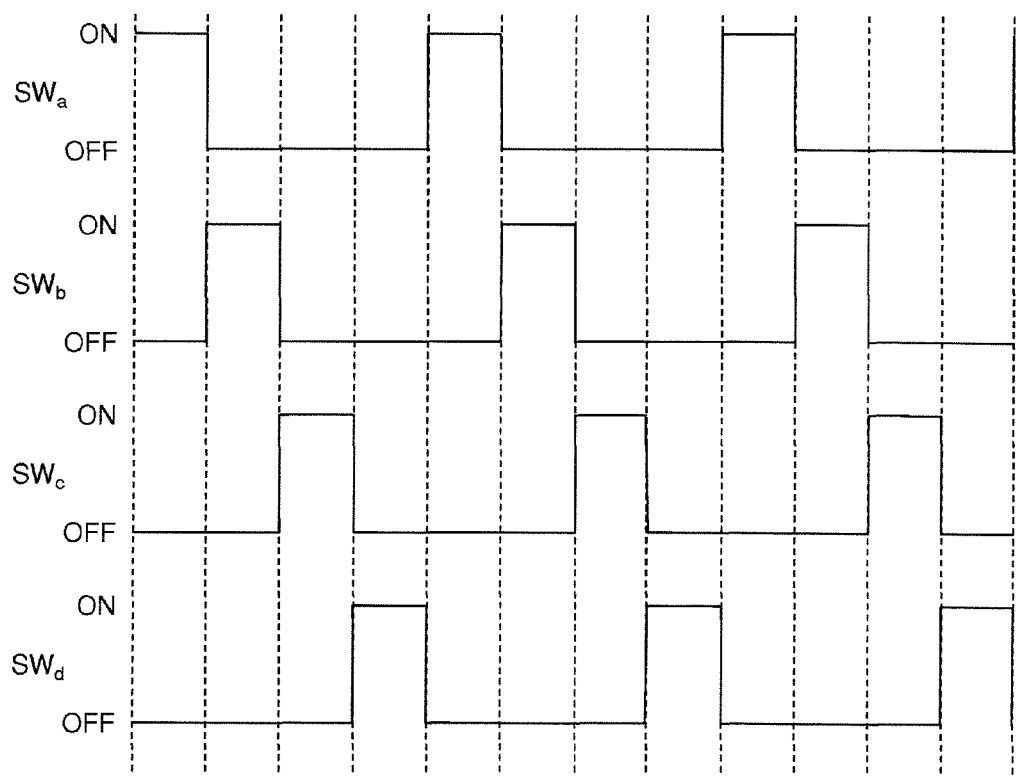

As described above, the circuit from FIG. 3a operates so as to integrate the input signal current, and thereby store a charge on each of the capacitors, which is proportional to the integral of the input signal over the period where the switch associated with that capacitor is on. This then results in charges, referred to as Qa, Qb, Qc, and Qd, which are the charges representative of accumulated values, specifically analog accumulated values, on each of the four capacitors Ca, Cb, Cc, Cd of FIG. 3a, during periods A, B, C, and D, respectively. FIG. 3b shows the timing of SWa, SWb, SWc, and SWd.

After as few as one full cycle (or perhaps after multiple cycles) each of the capacitors Ca, Cb, Cc, Cd, which have now accumulated a signal related charge as an accumulated value, are then dumped into a charge responding A to D converter 16, where a digitized accumulated value is developed, which is directly proportional to the amount of charge accumulated on each capacitor Ca, Cb, Cc, Cd. A separate A to D output value is acquired for each phase sector value, one for the charge accumulated during each of quadrature phase sectors A, B, C, and D.

If the conversion to digital is done at the end of every local clock cycle, there is one digital value for each quadrature phase A, B, C, and D, for each local clock cycle. However, if the integration continues over multiple local clock cycles, then there is only one digital value generated for each quadrature phase A, B, C, and D, for each multiplicity of local clock cycles. The number of cycles over which the integration continues before executing an A to D on the integrated values, becomes the down conversion factor. If the integration continues over five cycles, then the accumulated value converted by the A to D 16 is first integrated for each quadrature phase, over five cycles, and the value converted to digital is effectively an average of the input signals integration by phase sector, over the five cycles. This effectively executes a down conversion by a factor of five. This means the A to D 16 does not have to execute an A to D nearly as quickly. Furthermore, as before with the impulse sampled case, the data is averaged, so any random noise is reduced, while the signal in effect, gets larger because of the ongoing integration. None of the desired pass band data is lost unless the down-conversion factor becomes large enough to result in a restriction of the bandwidth to a value that is narrower than that of the data contained in the modulation of the modulated signal. Ideally, the down-conversion factor is chosen so as to make the bandwidth just large enough to avoid significantly limiting the bandwidth of the data. The exact bandwidth chosen would likely be chosen to provide the best signal to noise ratio of the resulting data.

If a local clock circuit which generates the full cycle described above, is synchronous (at the same frequency)

with the carrier frequency of a modulated signal present at the input of the circuit of FIG. 3a and if the static phase relationship between the local clock and incoming modulated signal is correctly set, the analog accumulated value represented by the charge accumulated on each of the capacitors Ca, Cb, Cc, Cd, after one full cycle, could then be selectively combined together in the correct polarities, and thereby reconstruct one RF cycle's worth of demodulated I and Q base-band signals, for that cycle.

Phase Sector Integration Capturing can be used in this way, to achieve modulation signal values, using analog discrete time methods. Selectively combining each of the capacitors charge values, with the correct polarity selection for each, amounts to the mixing function, and thereby reconstructs analog discrete time in-phase or quadrature signal values. This combining can be accomplished using any accumulated value combining system. Where the processing block is analog, the values are usually charges, and the combining is most commonly implemented using switched-capacitor techniques. Where the combining is accomplished using digital values, the accumulated values are just digital values in active memory, and the accumulated value combining system generally becomes a mathematical step executed by a program running on within a DSP block. Considering the case where analog modulation signal values are formed before digitization, this is done for each clock cycle, according to $Qi=Qa+Qb-Qc-Qd$, and $Qq=Qb+Qc-Qa-Qd$, where the charges Qi and Qq so formed are now representative of modulation signal values, analog modulation signal values, with Qi as a charge representing an in-phase modulation value, a single cycles reconstruction of the in-phase modulation, and with Qq representing a quadrature modulation value, a single cycles reconstruction of the quadrature modulation.

As described earlier however, there is great advantage in performing this mixing function in a post conversion manner instead. The point here is that these analog accumulated values contain the significance of the quadrature and in-phase signal components, and that this is one alternate and novel way that this Phase Sector Integration Capturing technique could be used. If this system were used this way, where discrete time analog modulation values are formed, it is also possible to then further combine these already mixed analog values, using a modulation value combining system, which would combine modulation values from multiple clock cycles, inherently creating a discrete time filter. This modulation value combining system could also be implemented within the DSP block, merely by performing the correct mathematical operations on digitized modulation values. Where implemented, this modulation value combining system would most typically be used to create a low pass, discrete time, or digital decimation filter.

The distributive property of multiplication over addition also applies over accumulation and suggests that if charge is accumulated first by phase sector and the accumulated values are then combined together in the correct polarity, that the resultant can be no different than if the values are first multiplied by the correct polarity and then accumulated all at once. Conventional mixing is achieved by multiplying the modulated signal by the correct polarity, and then accumulating all at once. This is necessarily done separately for I and Q, once multiplying by the inphase clock, FIG. 2 (f), and once by the quadrature clock, FIG. 2 (g). Each of these mixers outputs then get separately low pass filtered, similar to integration over its reject band, which is essentially accumulated all at once, without regard to phase sectors. Phase Sector Integrated Capturing can achieve the same resultants, but in a way that provides much greater flexibility by accumulating by phase sector first, then combining in the correct polarity to achieve modulation signal values.

For full flexibility, selective combining of accumulated values can be performed on digital accumulated values, after digitizing the analog accumulated values. The option of reconstructing the modulation signal value before digitization, by selectively combining the analog accumulated values, has already been described. Alternately, under some signal conditions, some portions of this selective combining might be performed before the A to D, with others left until after the conversion to digital. In some cases, this can be done by merely reconnecting using switched-capacitor techniques, the capacitors of FIG. 4, during different phase sectors of the four phase sector clock. This combines multiple phase sector accumulated values before the A to D conversion.

One novel and advantageous case of this, an alternate value combining system, is to again selectively combine the four phase sector correlated analog accumulated values, but now to obtain two analog accumulated values to be A to D converted for each local clock cycle, the charge values $Q1=Qb-Qd$, and $Q2=Qa-Qc$. This is particularly advantageous if frequency content slower than the desired signal were present as a large interfering signal. In this way the large interfering signal can be canceled, before it uses up range of the A to D converter 16. This is most directly accomplished using switched-capacitor type techniques, by reconnecting the integrating capacitors of FIG. 4, or perhaps by connecting the two non adjacent phase sectors to be combined, both to the charge responding A to D simultaneously. This option reduces the A to D conversion rate to two values per cycle, while also maintaining the benefits of post conversion mixing for the I and Q reconstructed modulation signals. This is another alternate enhancement of the current invention and is achieved by arranging clocking and switching of the capacitors of FIG. 4 so that two of the charging phases are combined and only two complete charge integrations are accomplished per full cycle of the clock, with each being a combination of two non-adjacent quadrature phase sectors of the full cycle clock. The I and Q signals can then be post conversion mixed using the digital modulation signal values obtained from performing the A to D conversion on Q1 and Q2, and where now $Qip=Q1+Q2=Qa+Qb-Qc-Qd$, and $Qq=Q1-Q2=Qb+Qc-Qa-Qd$.

This alternate combining system is one of several ways the RF2D 4 can be setup to accumulate and operate on the modulated signal, the accumulated values, and the modulation signal values. Different setups are likely to yield better signal to noise ratio than others, depending on signal conditions. These signal conditions can include a large set a variables, strong or weak signal, whether or not there is a strong interfering signal nearby in frequency or physically near the receiver so that it is overwhelming the desired signal, or whether or not there is rapidly changing fading conditions, just to name a few. The program running in the DSP 10 can adjust the selection of setups, to get the best signal to noise ratio, under current signal conditions.

As previously mentioned, it is intended here that there be no time during which more than one of the four switches SWa, SWb, SWc, SWd are simultaneously on. Given the imperfections of real timing and variations, it is difficult to avoid any simultaneous on time, without also providing for a period of time, however short, when all of the switches SWa, SWb, SWc, SWd are intentionally off. This would of course create a period of time, however short, where the input signal is ignored. This can lead directly to aliasing. One way of overcoming this is to make use of parasitic capacitance at the inverting input 30 of the op-amp 24. During any period where all of the switches are off, a transitory period, the parasitic capacitance at the inverting input of the op-amp 24, representing an auxiliary capacitive device, will begin to accumulate charge, and allow the voltage at the inverting input 30 to rise slightly. The charging of this auxiliary capacitive device continues until the next phase sector begins. As long as the next phase sector switch SWa, SWb, SWc, SWd turns on before this voltage rises too far, the voltage would be pulled right back to within its proper operating range as soon as the next switch turns on, while the charge that was accumulated by the parasitic capacitor at the inverting input would be redistributed exactly, onto the integrating capacitor Ca, Cb, Cc, Cd whose switch SWa, SWb, SWc, SWd is now on. In this way, after the switching transients have settled, the now on capacitor Ca, Cb, Cc, Cd would hold the same charge as if its switch SWa, SWb, SWc, SWd had been turned on fully at exactly the instant the previous switch SWa, SWb, SWc, SWd had been turned fully off.

Operating a Phase Sector Integration Capturing system in this way, assuring that there is no period of time during which the input signal is ignored by subsequent processing, is an advantage referred to as Continuous Signal Capturing. One major reason why this is so advantageous is that this completely avoids any need for anti-aliasing filters, and avoids the complexities of managing adjustable anti-aliasing filters otherwise required for a fully flexible receiver. Continuous Signal Capturing is achieved by performing continuous accumulation on the input signal. Whenever the input signal is no longer accumulated on the most recently charging integration capacitor Ca, Cb, Cc, Cd, it is now effectively becomes accumulated on the subsequent phase sector's capacitor Ca, Cb, Cc, Cd. Using another circuit architecture might require using one or more capacitive devices devoted to this auxiliary capacitive device's purpose, but with the Phase Sector Distributed Integrator circuit configuration, this parasitic input capacitance at the non-inverting input 26 of the op-amp 24 accomplishes this added feature, without the addition of a device devoted to this purpose. There are also other ways of accomplishing continuous signal capturing, though they are more complex in nature. This however, does not detract from the novelty of this entire methodology.

Another valuable enhancement to Phase Sector Integration Capturing, novel to Phase Sector Integration Capturing, is the fact that by selecting to accumulate the modulated signal input over multiple cycles of the local clock, a Phase Sector Distributed Integrator block can accumulate phase sector correlated values for phase sectors, A, B, C, and D, which represent low pass filtered, or decimation filtered accumulated values. In this way, the charge stored on capacitor Ca gets added to, by additional charge during a second phase A of a subsequent full cycle, and by each phase A of multiple subsequent full cycles. The charge already on capacitor Cb gets added to by a second and multiple subsequent phase B portions of second or multiple full cycles of the set of four switches. Capacitors Cc and Cd also, can thereby integrate charge over multiple full cycles of the set of four switches SWa, SWb, SWc, SWd. Charges accumulated in this way are still phase sector correlated, with each capacitor Ca, Cb, Cc, Cd accumulating charge only during its active phase sector of each local clock cycle. This is similar to the low pass filter used in conjunction with the impulse sampling method previously described, the simplest of which just adds up the input samples. However, with this integrating block, there is no additional circuitry required, and no additional components being clocked at the fastest clock rate, effectively 4 times the local clock rate. The same integrating capacitors Ca, Cb, Cc, Cd just continue to add up the charge over multiple local clock cycles. Just as with the impulse sampled input, the signal adds up over multiple local clock cycles, and the resulting integrated charge can be made available to a subsequent A to D converter 16 at a much slower, downconverted rate. There is also the same improvement in signal to noise ratio resulting from the averaging of the phase sector correlated charge components over time, as they are integrated onto each of their respective capacitors Ca, Cb, Cc, Cd, linearly compounding the amount of charge that is in response to the signal, while adding only stochastically, the amount of charge that is present on the each capacitor Ca, Cb, Cc, Cd due to noise.

While band narrowing does occur as a result of integrating the input signal over multiple full cycles of A, B, C, and D phases, this band narrowing is a function of the down-conversion factor, which is just Fclk/f_RF2Dout, and which is under the control of the DSP 10. As before, this down-conversion factor can be chosen so as to not narrow the band of the information contained in the modulated signal, or it can be chosen to narrow the band, if so desired.

Subsequently, both I and Q are first formed after digitization has occurred using a single A to D block 16. I and Q are formed in the DSP 10 by combining, in the right polarity, the values collected during each of the quadrature phase sectors. This again constitutes Post Conversion Mixing with all of the same advantages as previously described, all profound in several ways. The mixing and filtering to provide the control voltage for the voltage controlled oscillator portion of the PLL is also the same as previously described.

Various methods of reconstructing a modulation signal have been discussed here. Each of the methods discussed has some combination of RF environment or receiving conditions under which it might represent the best method of signal reception. This PSB-SDR system is capable of switching between all of these methods as signals are being received. This switching can be done in some cases by changing the signals clocking various switched-capacitor circuits, in some cases by switching different components in or out of the circuits, and in many cases by merely altering the program steps that are being applied to the digitized signals as they propagate through the DSP block. These choices can all be made under program control, by any programmable control unit, which most typically is just the DSP block. This can be done in response to a modulation signal evaluator, which is most likely constituted by lines of code in the program running on the DSP, but might also be implemented in some cases, by dedicated hardware circuitry. In either case, this modulation signal evaluator can evaluate the reconstructed modulation signal relative to any number of characterization metrics, many determined by mere mathematical processing of the reconstructed modulation signal, which could be done by any processing system, but generally for this PSB-SDR system, the processing system is the DSP block.

Everything described to this point has mostly been describing the various features of this PSB-SDR system 2 as applied to achieve a receiver, receiving a modulated signal. The transmitter portion of a radio system can also be greatly enhanced by all of the previously described techniques. A number of conventional transmitter methods and techniques can be applied to this system, while managed from the DSP block 10 of this PSB-SDR 2. This system provides for a relatively wide-band, and thereby a relatively fast, acquisition of reconstructed I and Q modulation signal values from a modulated signal. This enables the use of a closed loop feedback system, which is amply stable, incorporating the transmitter block in the loop. For transmit mode, a transmit/receive mode control, generally a control signal or control bit from the DSP block 10, switches the modulated signal input to the PSCC block 14 from a received signal over to an attenuated version of the transmitter's output. The PSCC block 14 then provides reasonably quick feedback to the DSP block 10, so that it can compare the actual transmit signal to a desired transmit signal and make calculated adjustments to the signals driving the transmit block 32, as necessary to achieve the desired transmit signal at the output of the transmitter 32. In this way, the output of the transmitter 32 is in effect regulated to match the desired signal, so that the desired transmit signal is achieved at the output of the transmitter 32, greatly mitigating non-linearities, and thermal non-idealities, of the transmit block 32. Conventional systems have not been able to take this approach, because conventional systems have much too much delay in any signal path which reconstructs a modulation signal or component from a modulated signal by conventional means.

The digital transmission values that are output from the DSP 10 are converted to analog values by the RF DAC 34. This DAC 34 also includes a fast Phase Sector Distributed Output block, which steps through various analog phase sector correlated output values, providing each value in the form of either a current or a voltage proportional to this phase sector correlated output value to the transmitter 32 for transmission. The values that are distributed for each phase sector are generally updated much more slowly, by a digital to analog conversion of the data provided by the DSP 10. Because of this arrangement, the data update rate out of the DSP 10 does not have a full RF transmission rate, but can have an update rate more on the order of the bandwidth of the resulting RF transmission, rather than up at the carrier frequency.

This PSB-SDR system 2 provides for a zero IF, direct RF down-conversion technique, which converts as directly as possible, an RF band-constrained signal located at a center frequency, to a clocked parallel data stream. The center frequency at which RF information is down-converted from is determined by the frequency of the local clock, Fclk. This local clock is developed by the local clock generation block 12, under the control of the DSP 10. A down-conversion factor is given by the ratio of the local clock to the frequency of the complete cycle output rate of the A to D conversion block 16, or Fclk/f_RF2Dout. This ratio is an integer ratio, also controlled by the DSP block 10. One block within the PSB-SDR 2, the RF2D 14, essentially performs an RF to digital conversion. The output of this block 4 is a stream of multiple bit wide data, provided to the DSP block 10. The PSB-SDR 2 incorporates a transmitter 32, also controlled by the DSP 10, with a reconstructed modulation signal generated by the RF2D block 4 from the output of the transmitter fed back to the DSP 10, allowing the DSP 10 to maintain closed loop control of the transmitted output signal. This system is capable of receiving and transmitting in accordance with any transmission or wireless standard, requiring only programming to do so, and is limited in RF application only by the operational bandwidth limitations imposed by the semiconductor process into which it is fabricated.

FIGS. 5a-13 are flow charts representing steps of various embodiments of aspects of the present invention. Although the steps represented in these Figures are presented in a specific order, the technology presented herein can be performed in any variation of this order. Furthermore, additional steps may be executed between the steps illustrated in these Figures.

Figure 5A:
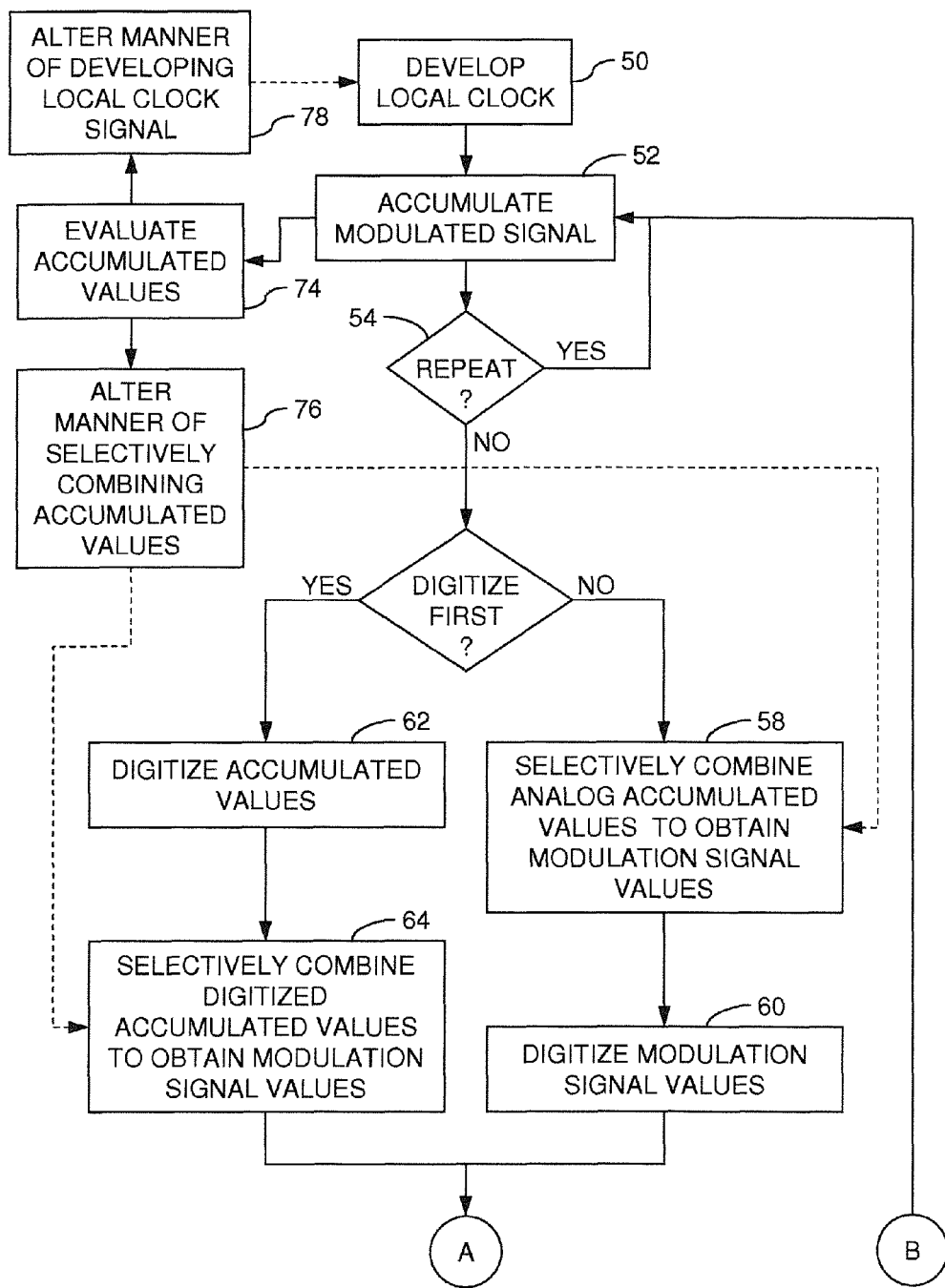
FIGS. 5a-b are a flow chart showing one embodiment of the present invention method for extracting values representative of modulation signal components from a modulated signal.
Figure 5B:
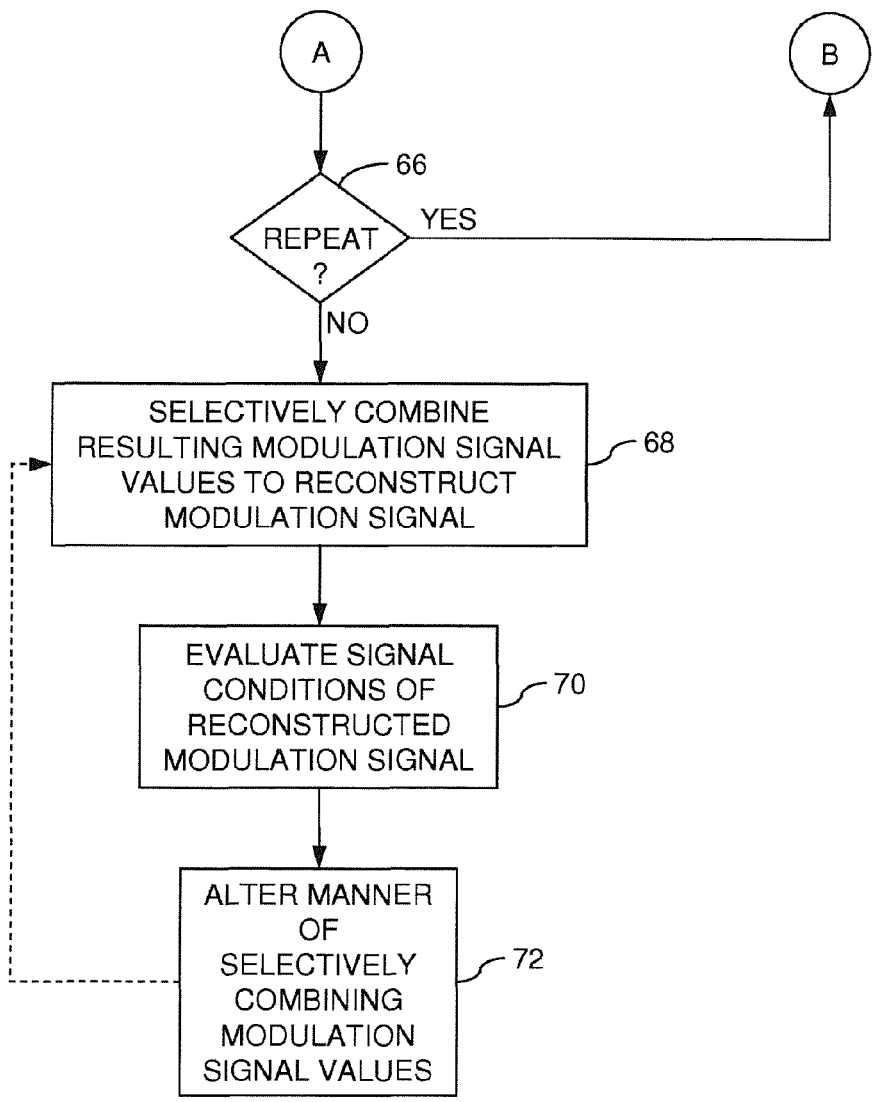

FIGS. 5a-b are a flow chart representing steps of one embodiment method for extracting values representative of modulation signal components from a modulated signal. A local clock signal is developed 50, which correlates in time to the modulated signal and has a plurality of non-overlapping phase sectors per cycle.

The modulated signal is accumulated 52 into an accumulated value, separately for at least one phase sector of one cycle of the local clock signal. In one embodiment, the modulated signal is accumulated by analog means and the accumulated values are analog accumulated values. Each accumulated value is representative of a modulation signal component. The modulated signal accumulated is of an amount representative of the mathematical integral of the modulated signal during each phase sector of the local clock over which the modulated signal is accumulated.

In one embodiment, each accumulated value represents the amount accumulated over one phase sector. In an alternative embodiment, at least one accumulated value includes amounts accumulated in either polarity, selectively, over multiple phase sectors of one cycle of the local clock.

Figure 6:
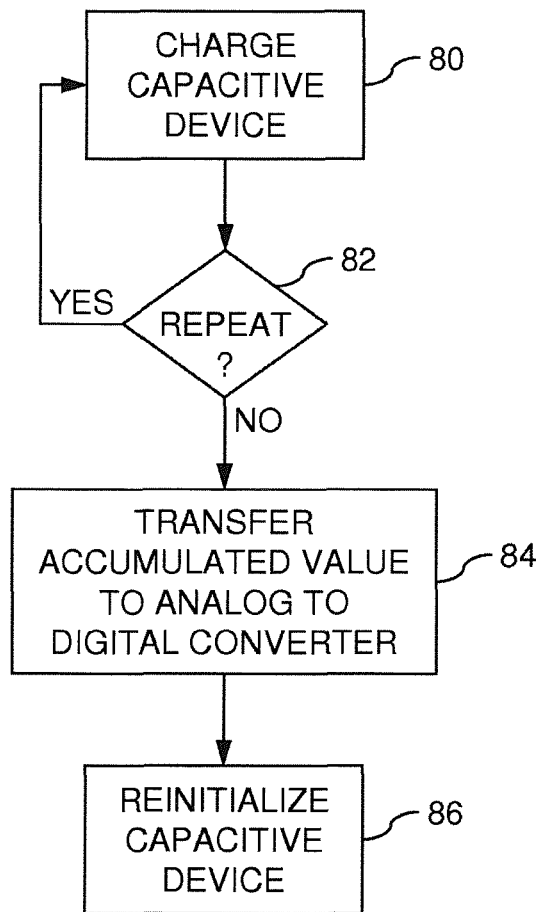
FIG. 6 is a flow chart showing one embodiment of a method for accumulating a modulated signal with a capacitive device.

FIG. 6 illustrates one embodiment for accumulating the modulated signal into an accumulated value. A capacitive device is charged 80 with the modulated signal such that the accumulated charge on the capacitive device is the accumulated value. The charging process 80 is repeated 82 for as many clock cycles and phase sectors as desired. The accumulated value is then transferred 84 to an analog to digital converter and the capacitive device is reinitialized 86.

Returning to FIGS. 5a-b, the accumulating step is repeated 54 during multiple cycles of the local clock. In one embodiment, at least one accumulated value includes amounts accumulated during multiple cycles of the local clock. In one embodiment, the accumulated values include amounts accumulated during the same phase sector of multiple cycles of the local clock.

In one embodiment, accumulating the modulated signal into an accumulated value includes a switched capacitor filter accumulating the modulated signal over multiple clock cycles. In one embodiment, the switched capacitor filter is a low pass filter.

In one embodiment, the accumulated values are selectively combined 58, 64 to obtain at least one modulation signal value representative of the modulation signal. Selectively combining 58, 64 the accumulated values includes selecting whether to combine any accumulated values, which accumulated values to combine, and whether to add or subtract the accumulated values. In one embodiment, analog accumulated values are selectively combined 58 to obtain analog modulation signal values representative of the modulation signal and the analog modulation signal values are digitized 60 to obtain digital modulation signal values representative of the modulation signal.

In an alternative embodiment, analog accumulated values are digitized 62 to obtain digitized accumulated values and the digitized accumulated values are selectively combined 64 to obtain digital modulation signal values representative of the modulation signal.

The accumulating and combining steps are repeated 66 over multiple cycles of the local clock signal. In one embodiment, the resulting modulation signal values are selectively combined 68 to reconstruct the modulation signal. Selectively combining 68 the modulation signal values includes selecting whether to combine any modulation signal values, which modulation signal values to combine, and whether to add or subtract the modulation signal values.

In one embodiment, signal conditions of the reconstructed modulation signal are evaluated 70. The manner of selectively combining 68 the resulting modulation signal values is altered 72, as necessary or desirable, based on the signal conditions.

In one embodiment, the accumulated values are evaluated 74 and the manner of selectively combining 58, 64 the accumulated values is altered 76 based on the evaluation 74. In one embodiment, the accumulated values are selectively combined 58, 64 as directed by an instruction from a programmable control unit, of which the digital signal processor 10 is one example.

In another embodiment, the manner of developing 50 the local clock signal is altered 78 based on the evaluation 74. Altering 78 the manner of developing the local clock signal includes selectively altering the number of phase sectors per cycle, frequency, and phase of the local clock signal.

Figure 7:
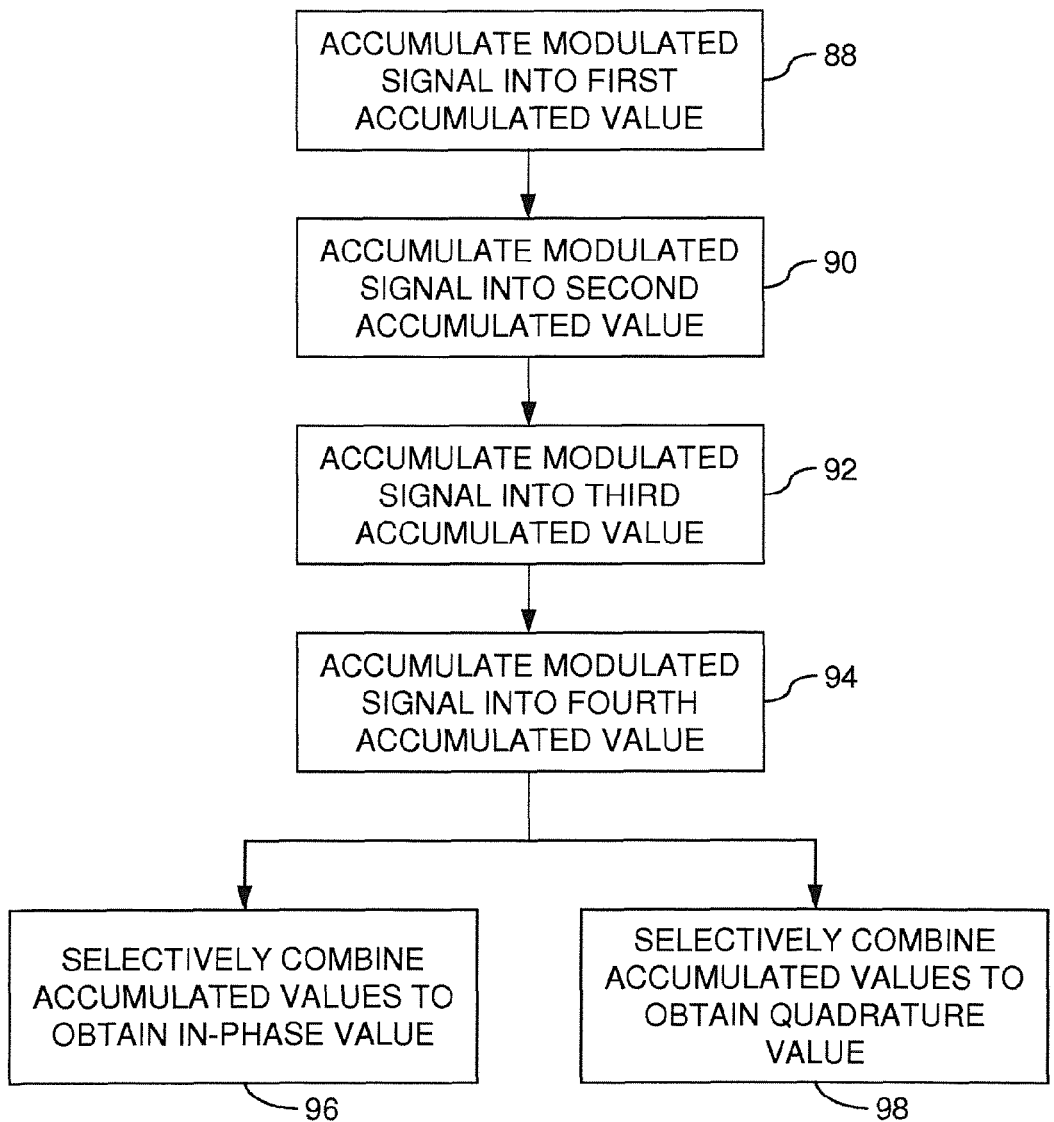
FIG. 7 is a flow chart showing one embodiment of accumulating and combining accumulated values.

FIG. 7 illustrates one embodiment where the modulation signal includes in-phase and quadrature signals and the accumulated values form in-phase and quadrature signal components or are combined to form in-phase and quadrature signal components. There are four phase sectors per cycle.

The modulated signal is accumulated 88, 90, 92, 94 separately during each phase sector of one cycle of the local clock signal, into first, second, third, and fourth accumulated values. The first, second, third, and fourth values are selectively combined 96 to obtain an in-phase value representative of the in-phase signal. The first, second, third, and fourth values are also selectively combined 98 to obtain a quadrature value representative of the quadrature signal.

Figure 8:
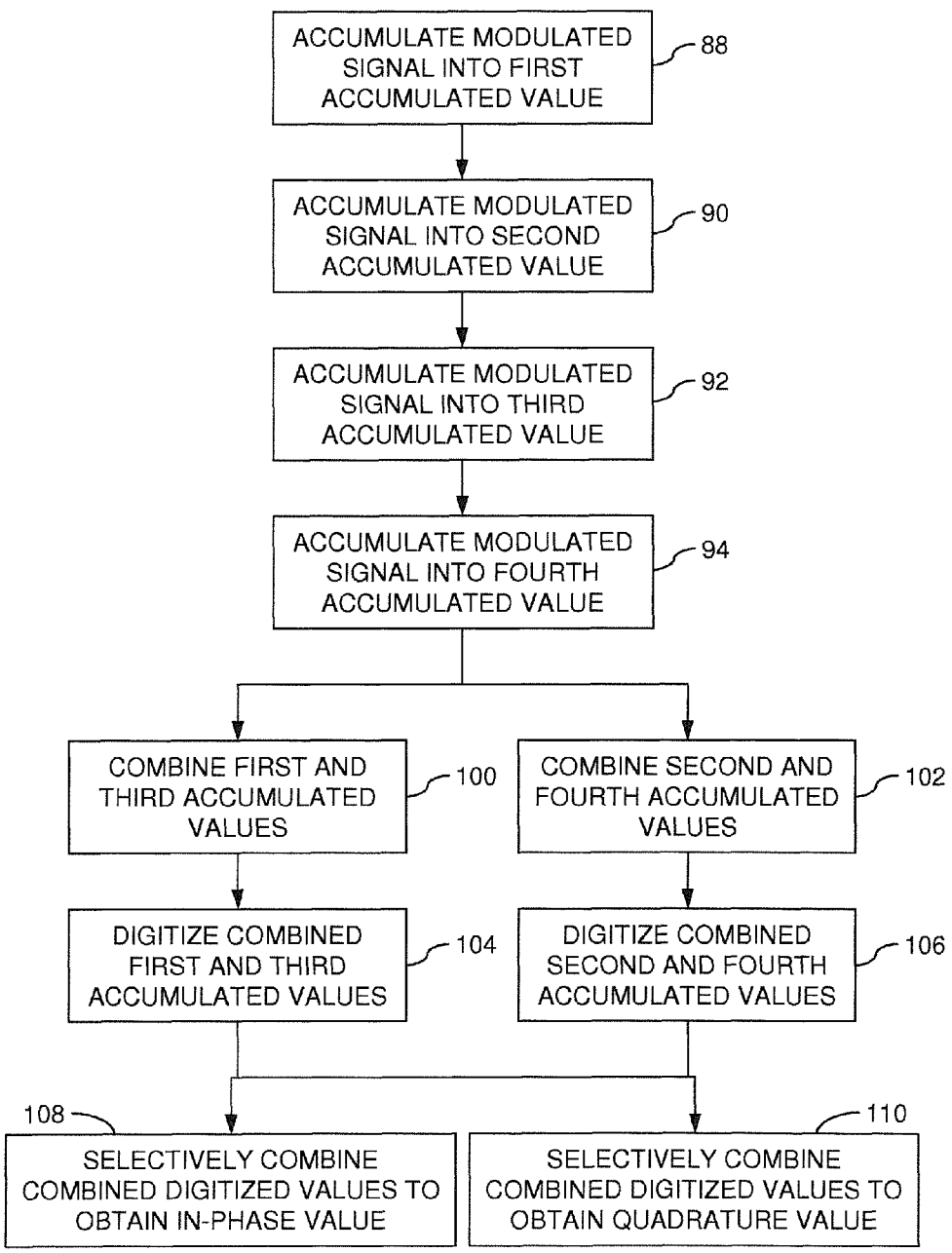
FIG. 8 is a flow chart showing an alternate embodiment of accumulating and combining accumulated values.

FIG. 8 shows an alternative embodiment for obtaining the in-phase and quadrature values. The first and third values are combined 100 and the second and fourth values are combined 102. In one embodiment, combining 100 the first and third values includes during the first and third phase sectors of the local clock signal charging a first capacitive device with the modulated signal and combining 102 the second and fourth values includes during the second and fourth phase sectors of the local clock signal charging a second capacitive device with the modulated signal.

The combined first and third values are digitized 104 and the combined second and fourth values are digitized 106. The digitized combined second and fourth values are combined 108 with the digitized combined first and third values to obtain the in-phase values and the digitized combined second and fourth values are combined 110 with the digitized combined first and third values to obtain the quadrature values.

Figure 9:
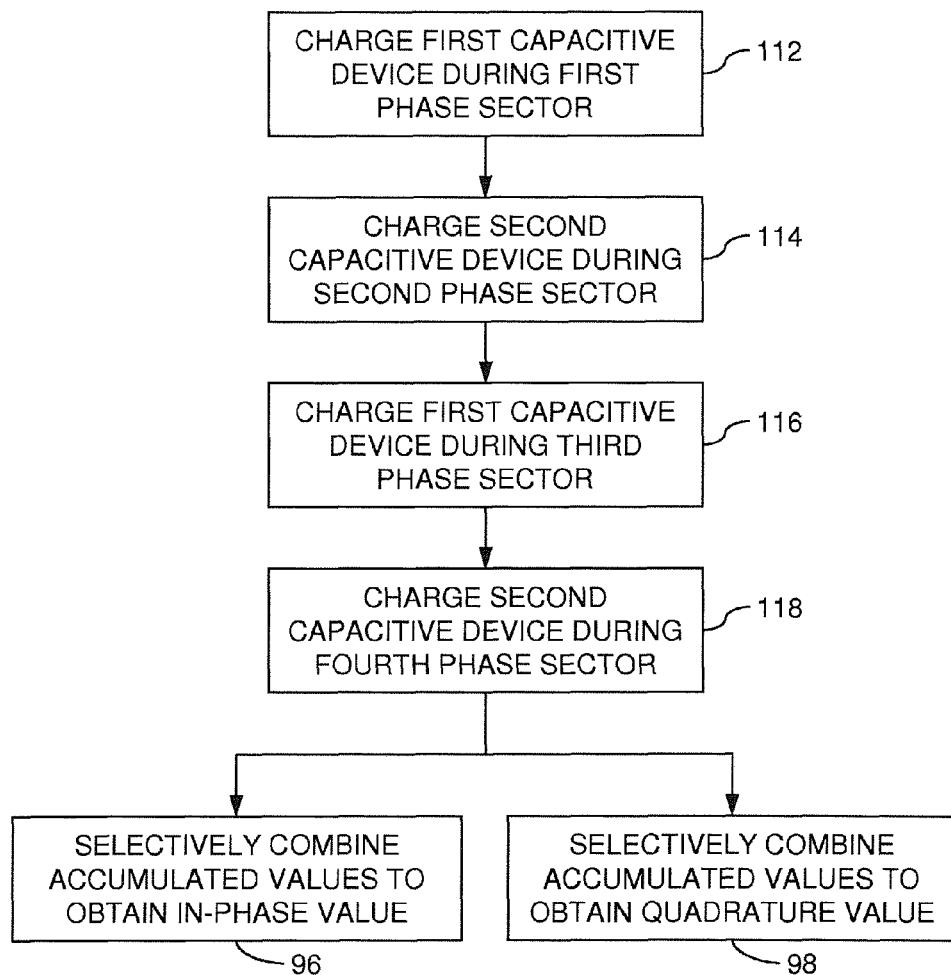
FIG. 9 is a flow chart showing another embodiment of accumulating and combining accumulated values.

FIG. 9 illustrates another embodiment for accumulating the modulated signal where there are four phase sectors per cycle. During the first phase sector of the local clock signal, a first capacitive device is charged 112 with the modulated signal. During the second phase sector of the local clock signal, a second capacitive device is charged 114 with the modulated signal. During the third phase sector of the local clock signal, a third capacitive device is charged 116 with the modulated signal. During the fourth phase sector of the local clock signal, a fourth capacitive device is charged 118 with the modulated signal.

Figure 10:
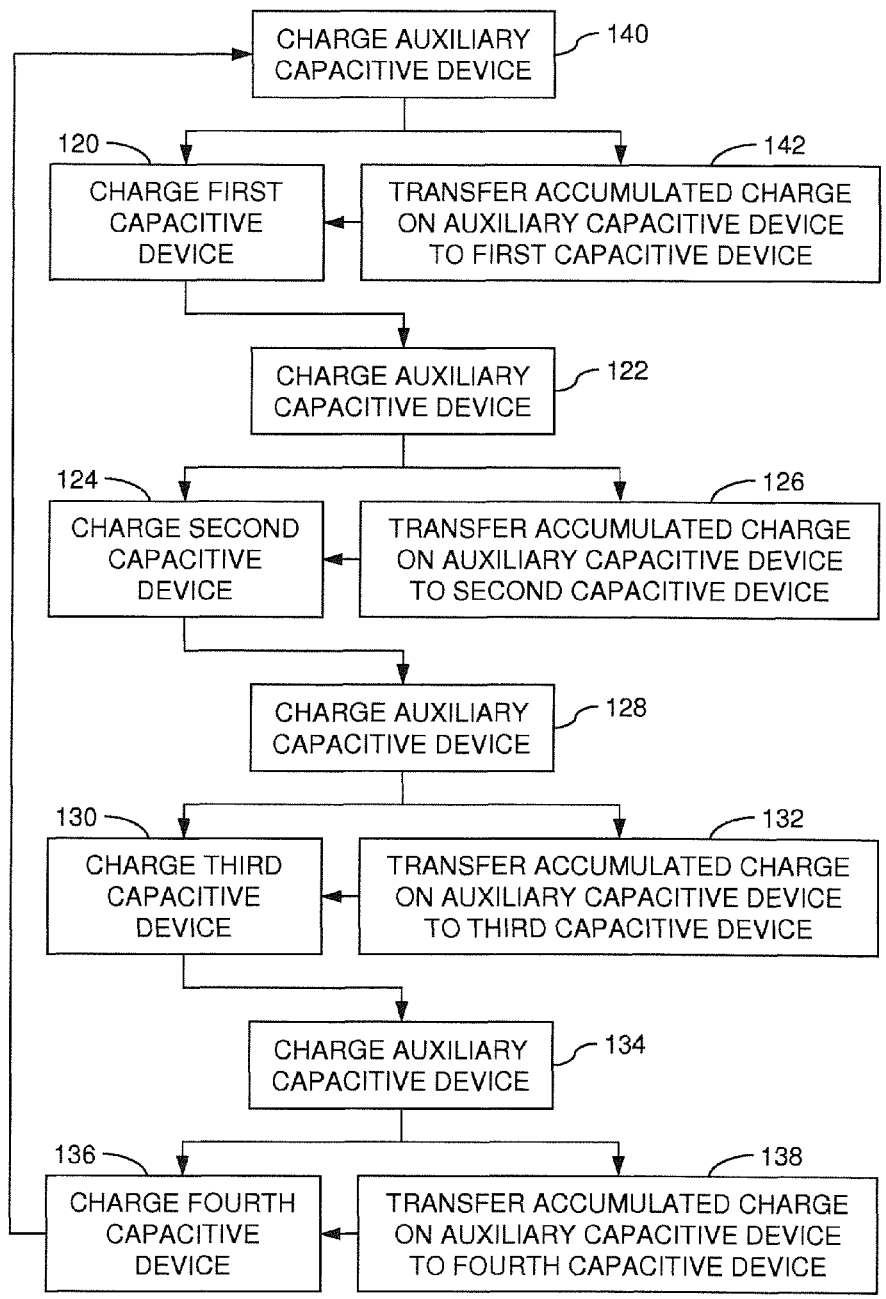
FIG. 10 is a flow chart showing one embodiment of a method for continuously accumulating charge.

In one embodiment, the modulated signal is continuously accumulated over a plurality of cycles of the local clock so that there are no intervals during the plurality of cycles wherein the modulated signal is not accumulated. FIG. 10 illustrates one embodiment for continuously accumulating the modulated signal. For the first accumulated value, a first capacitive device is charged 120 with the modulated signal. An auxiliary capacitive device is charged 122 with the modulated signal during the transitory period between phase sectors. For the second accumulated value, a second capacitive device is charged 124 with the modulated signal. The accumulated charge on the auxiliary capacitive device is transferred 126 to the second capacitive device while the second capacitive device is charging 124.

The auxiliary capacitive device is charged 128 with the modulated signal during the transitory period between charging the second capacitive device and the third capacitive device. The third capacitive device is charged 130 with the modulated signal. The accumulated charge on the auxiliary capacitive device is transferred 132 to the third capacitive device while the third capacitive device is charging 130.

The auxiliary capacitive device is charged 134 with the modulated signal during the transitory period between charging the third capacitive device and the fourth capacitive device. The fourth capacitive device is charged 136 with the modulated signal. The accumulated charge on the auxiliary capacitive device is transferred 138 to the fourth capacitive device while the fourth capacitive device is charging 138.

The auxiliary capacitive device is charged 140 with the modulated signal during the transitory period between charging the fourth capacitive device and the first capacitive device. The first capacitive device is charged 120 with the modulated signal. The accumulated charge on the auxiliary capacitive device is transferred 142 to the first capacitive device while the first capacitive device is charging 120. Although the preceding description refers to only one auxiliary capacitive device, multiple auxiliary capacitive devices may be used to accomplish this capture and transfer of charge accumulated between phase sectors.

Figure 11:
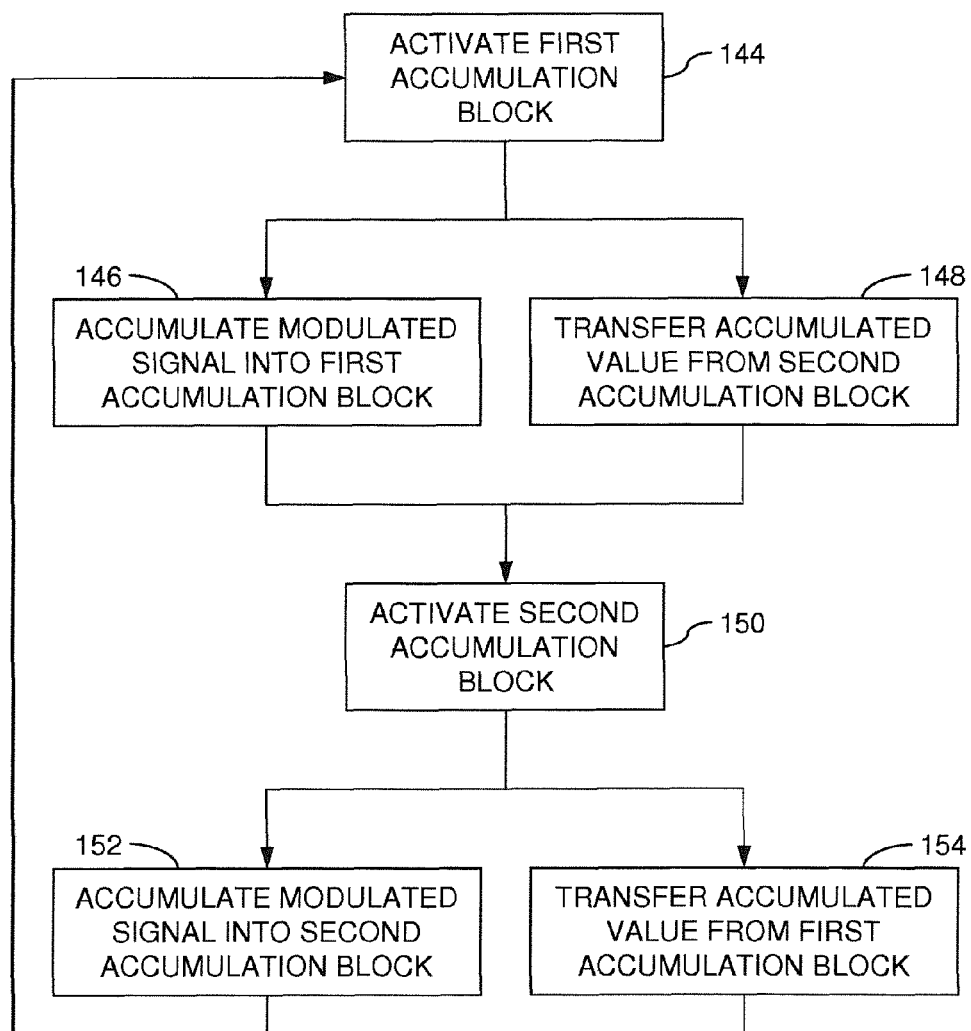
FIG. 11 is a flow chart showing a method for using the alternating blocks of FIG. 4.

FIG. 11 illustrates an alternate embodiment for accumulating the modulated signal into an accumulated value. A first accumulation block is activated 144. When activated, the first accumulation block accumulates 146 the modulated signal into an accumulated value. While the first accumulation block is accumulating 146, an accumulated value is transferred 148 from a second accumulation block. The second accumulation block is activated 150. When activated, the second accumulation block accumulates 152 the modulated signal into an accumulated value. While the second accumulation block is accumulating 152, an accumulated value is transferred 154 from the first accumulation block.

Figure 12:
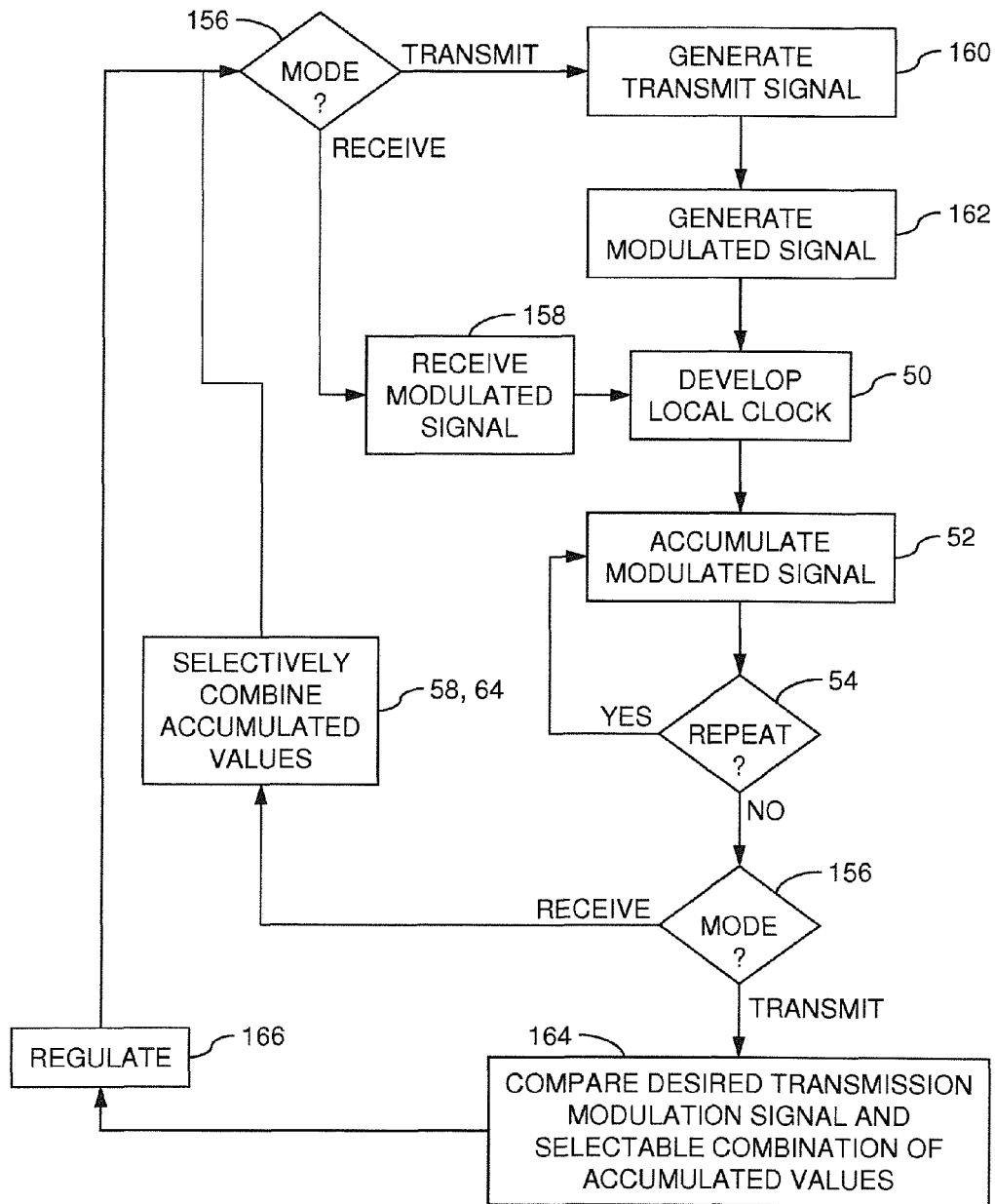
FIG. 12 is a flow chart showing one embodiment for the method of the present invention including a transmit mode.

FIG. 12 illustrates one embodiment for the method of the present invention including a transmit mode. The present invention is useful in both a receive mode and a transmit mode and may be selectively switched 156 between the modes. In one embodiment, a single digital signal processing system selectively switches 156 between the transmit and receive modes, supplying data to a transmitter to transmit, and obtaining data from a receiver.

In the receive mode, the modulated signal is a received 158 modulated signal. In the transmit mode, a transmit signal is generated 160 and the modulated signal is generated 162 by attenuating the transmit signal. In the transmit mode, a desired transmission modulation signal is compared 164 to a selectable combination of the accumulated values. The generation 160 of the transmit signal is regulated 164 with the comparison between the desired transmission modulation signal and the selectable combination of the accumulated values.

Figure 13:
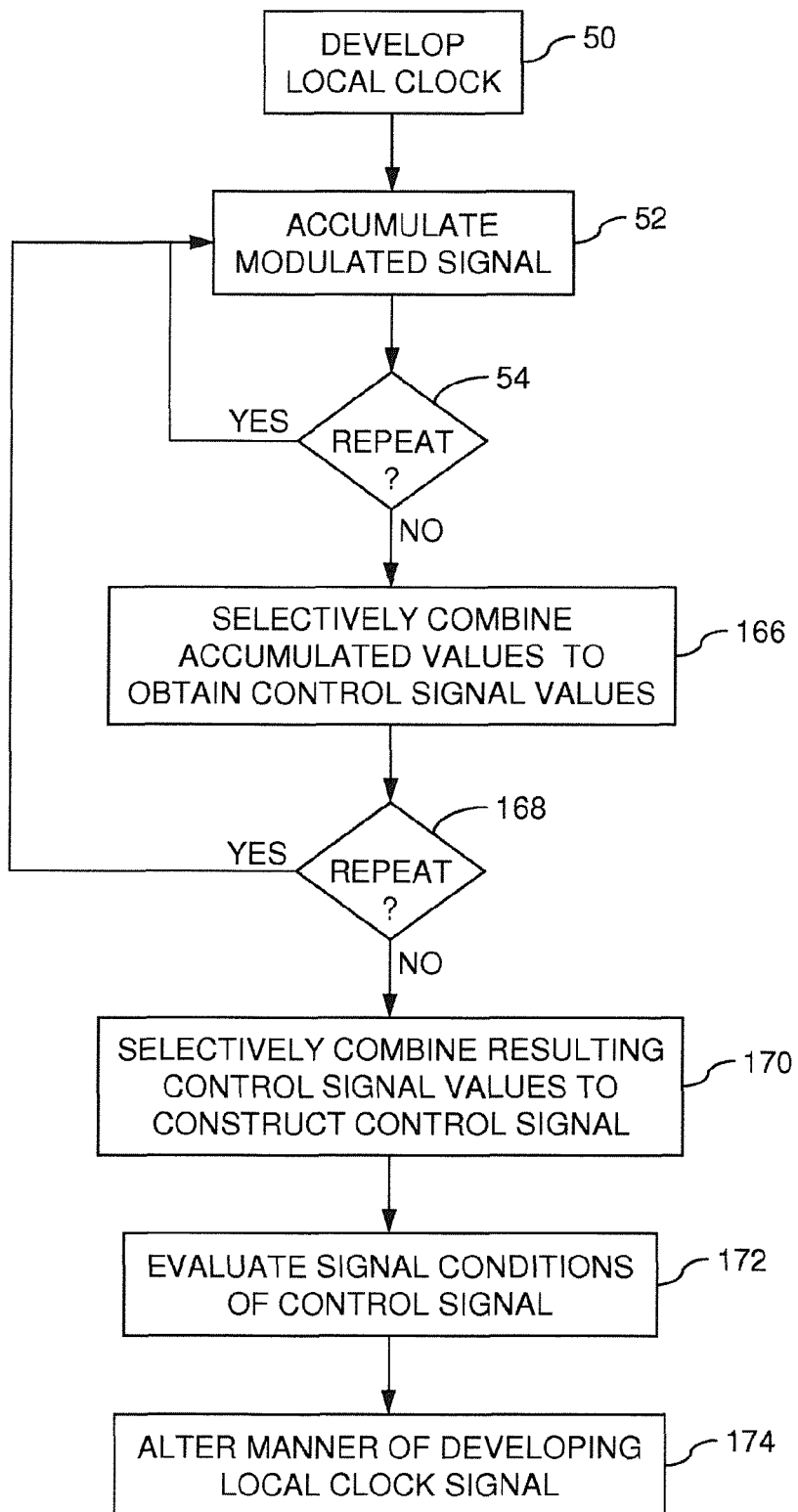
FIG. 13 is a flow chart illustrating one embodiment for altering a local clock signal.

FIG. 13 illustrates an alternate embodiment for altering the local clock signal. The accumulated values are selectively combined 166 to obtain at least one control signal value representative of a control signal. The accumulating and combining steps are repeated 168 over multiple cycles of the local clock signal. The resulting control signal values are selectively combined 170 to construct a control signal. Signal conditions of the control signal are evaluated 172. The manner of developing the local clock signal is altered 174 based on the signal conditions.

The methods and systems disclosed herein accomplish the highest goal of SDR, to provide hardware which provides fully flexible reception and transmission, in any programmable format, of any modulated signal, and without compromising performance.

The foregoing description is only illustrative of the invention. Various alternatives and modifications can be devised by those skilled in the art without departing from the invention. Accordingly, the present invention embraces all such alternatives, modifications, and variances that fall within the scope of the appended claims.

I claim:

1. A method for extracting values representative of modulation signal components from a modulated signal, the method comprising:
developing a local clock signal which correlates in time to the modulated signal and includes a plurality of non-overlapping phase sectors per cycle;
converting the modulated signal into a current that is a replica of the modulated signal;
directing the current to an amplifier having an inverting input and an output to charge one of a plurality of capacitive devices during each phase sector; and
sequentially connecting the capacitive devices between the output of the amplifier and the input of the amplifier in non-overlapping sequences equal to one full cycle of the local clock.

2. The method of claim 1, wherein the amplifier is an operational amplifier.

3. The method of claim 1, wherein a voltage representative in value of a modulation signal component is developed across one or more of the capacitive devices.

4. The method of claim 3, wherein a voltage representative in value of a modulation signal component is developed across one or more of the capacitive devices, over many cycles of the local clock.

5. The method of claim 4, wherein the capacitive device is increased or decreased in capacitance to maintain the voltage within a desired range.

6. The method of claim 1, wherein sequentially connecting the capacitive devices between the output of the amplifier and the input of the amplifier in non-overlapping sequences equal to one full cycle of the local clock, includes sequentially connecting the capacitive devices between the output of the amplifier and the input of the amplifier in non-overlapping sequences wherein each sequence is approximately equal in duration to one full cycle of the local clock.

7. An apparatus for extracting values representative of modulation signal components from a modulated signal, the apparatus comprising:
means for developing a local clock signal which correlates in time to the modulated signal and includes a plurality of non-overlapping phase sectors per cycle;
an amplifier having an output and an inverting input;
means for developing a current representative of the modulated signal, said current applied to the inverting input of the amplifier;
a plurality of capacitive devices at least equal to the plurality of phase sectors per cycle; and
a plurality of switches at least equal to the plurality of phase sectors per cycle, each switch being in series with one of the plurality of capacitive devices, wherein each serial combination of capacitive device and switch is in parallel with each other serial combination of capacitive device and switch and the amplifier between the output and the inverting input.

8. The apparatus of claim 7, wherein the amplifier is an operational amplifier.

9. The apparatus of claim 7, wherein the switches are transistors.

10. The apparatus of claim 7, wherein a voltage representative in value of a modulation signal component is developed across one or more of the capacitive devices.

11. A method for extracting values representative of modulation signal components from a modulated signal, the method comprising:
developing a local clock signal which includes a plurality of phase sectors per cycle;
converting the modulated signal into a current that is a replica of the modulated signal;
directing the current to an amplifier having an inverting input and an output to charge one of a plurality of capacitive devices during each phase sector;
sequentially connecting the capacitive devices between the output of the amplifier and the input of the amplifier in a sequence spanning one full cycle of the local clock; and
sampling the charge accumulated on one of the plurality of capacitive devices to obtain each value representative of a modulation signal component.

12. The method of claim 11, wherein the sampling of the charge accumulated on one of the plurality of capacitive devices, is sampled by dumping the charge to a charge responding analog to digital converter.

13. The method of claim 12, wherein the sampling of the charge accumulated on each of the capacitive devices is dumped to the same charge responding analog to digital converter at different times.

14. The method of claim 13, wherein the different times constitute a sequential conversion to digital of the charge accumulated on each of the plurality of capacitive devices, providing a sequence of digital output values.

15. The method of claim 14, wherein each of the sequence of digital output values is representative of a modulation signal component.

16. The method of claim 11, wherein the sampling of the charge accumulated on one of the plurality of capacitive devices, is sampled by dumping the charge to a charge responding analog output block.

17. The method of claim 16, wherein the sampling of the charge accumulated on each of the capacitive devices is dumped to the same charge responding analog output block at different times.

18. The method of claim 17, wherein the different times constitutes a sequence during which the charge accumulated on each of the plurality of capacitive devices is converted to an analog output value, providing a sequence of analog output values.

19. The method of claim 18, wherein each analog output value of the sequence of analog output values is representative of a modulation signal component.

20. The method of claim 11, wherein each value representative of a modulation signal component is an analog value.

\* \* \* \* \*